US012580023B2

(12) United States Patent
Wang et al.

(10) Patent No.: US 12,580,023 B2
(45) Date of Patent: Mar. 17, 2026

(54) BIT LINE TIMING BASED CELL TRACKING QUICK PASS WRITE FOR PROGRAMMING NON-VOLATILE MEMORY APPARATUSES

(71) Applicant: Sandisk Technologies, Inc., Milpitas, CA (US)

(72) Inventors: Ming Wang, Shanghai (CN); Liang Li, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 157 days.

(21) Appl. No.: 18/368,951

(22) Filed: Sep. 15, 2023

(65) Prior Publication Data

US 2025/0095742 A1 Mar. 20, 2025

(51) Int. Cl.
| | |
|---|---|
| *G11C 16/10* | (2006.01) |
| *G11C 11/56* | (2006.01) |
| *G11C 13/00* | (2006.01) |
| *G11C 16/04* | (2006.01) |
| *G11C 16/08* | (2006.01) |
| *G11C 16/24* | (2006.01) |
| *G11C 16/34* | (2006.01) |

(52) U.S. Cl.
CPC .......... *G11C 16/10* (2013.01); *G11C 11/5628* (2013.01); *G11C 13/0064* (2013.01); *G11C 16/0483* (2013.01); *G11C 16/08* (2013.01); *G11C 16/24* (2013.01); *G11C 16/34* (2013.01); *G11C 16/3427* (2013.01); *G11C 16/3459* (2013.01); *G11C 2013/0076* (2013.01); *G11C 2013/0092* (2013.01)

(58) Field of Classification Search
CPC ..... G11C 16/10; G11C 16/0483; G11C 16/08; G11C 16/24; G11C 16/3459; G11C 11/5628
See application file for complete search history.

(56) References Cited

U.S. PATENT DOCUMENTS

| | | | |
|---|---|---|---|
| 8,274,838 B2 | 9/2012 | Dutta et al. | |
| 9,013,928 B1 | 4/2015 | Dutta et al. | |
| 9,299,443 B1 | 3/2016 | Dong et al. | |
| 10,796,753 B1 | 10/2020 | Huang et al. | |
| 11,322,204 B2 | 5/2022 | Shibuya | |
| 2019/0362799 A1* | 11/2019 | Yang ...................... G11C 16/10 |
| 2023/0056891 A1* | 2/2023 | Lien ................... G11C 16/3459 |
| 2024/0194278 A1* | 6/2024 | Guo ........................ G11C 16/10 |

* cited by examiner

*Primary Examiner* — Donald HB Braswell
(74) *Attorney, Agent, or Firm* — Dickinson Wright PLLC

(57) ABSTRACT

A memory apparatus includes memory cells connected to word lines and configured to store a threshold voltage corresponding to data states. The memory cells are disposed in memory holes coupled to bit lines. A control means applies program pulses to selected ones of the word lines. The control means determines when the threshold voltage of each of the memory cells exceeds a lower verify level of one of the data states targeted and maintains a respective count of a number of the program pulses subsequently applied thereto before reaching a lockout state. Each of the program pulses is divided into phases. The control means sets a voltage of one of the bit lines coupled to each of the memory cells at a stepped up level as a function of the respective count and according to each of the phases in which the voltage is set to the stepped up level.

20 Claims, 14 Drawing Sheets

FIG. 3B    FIG. 3C    FIG. 3D

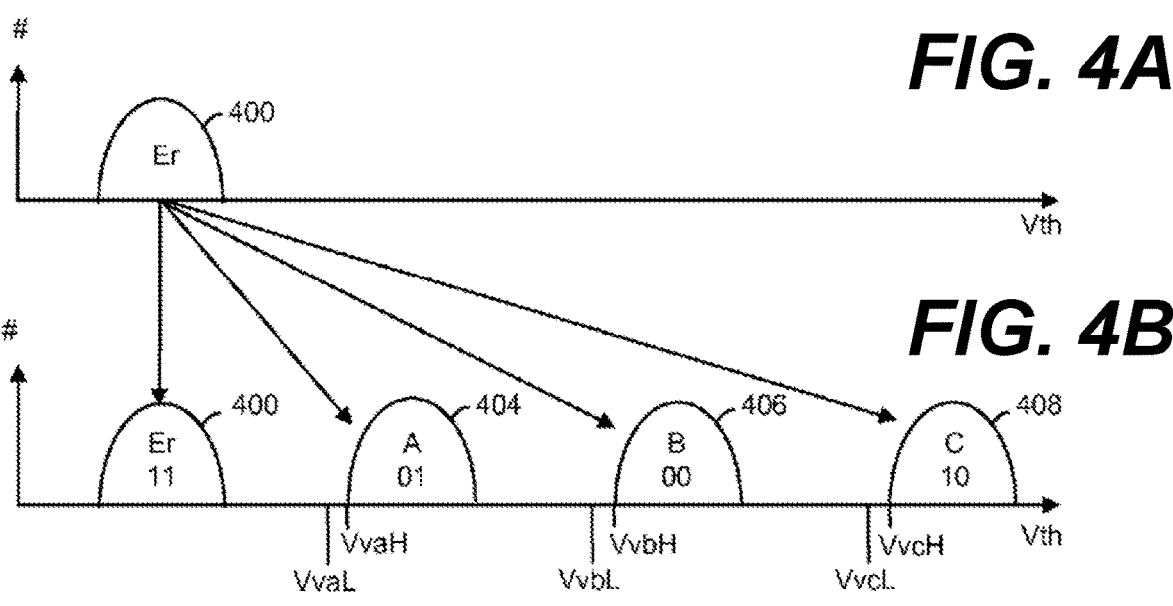
*FIG. 4A*
*FIG. 4B*
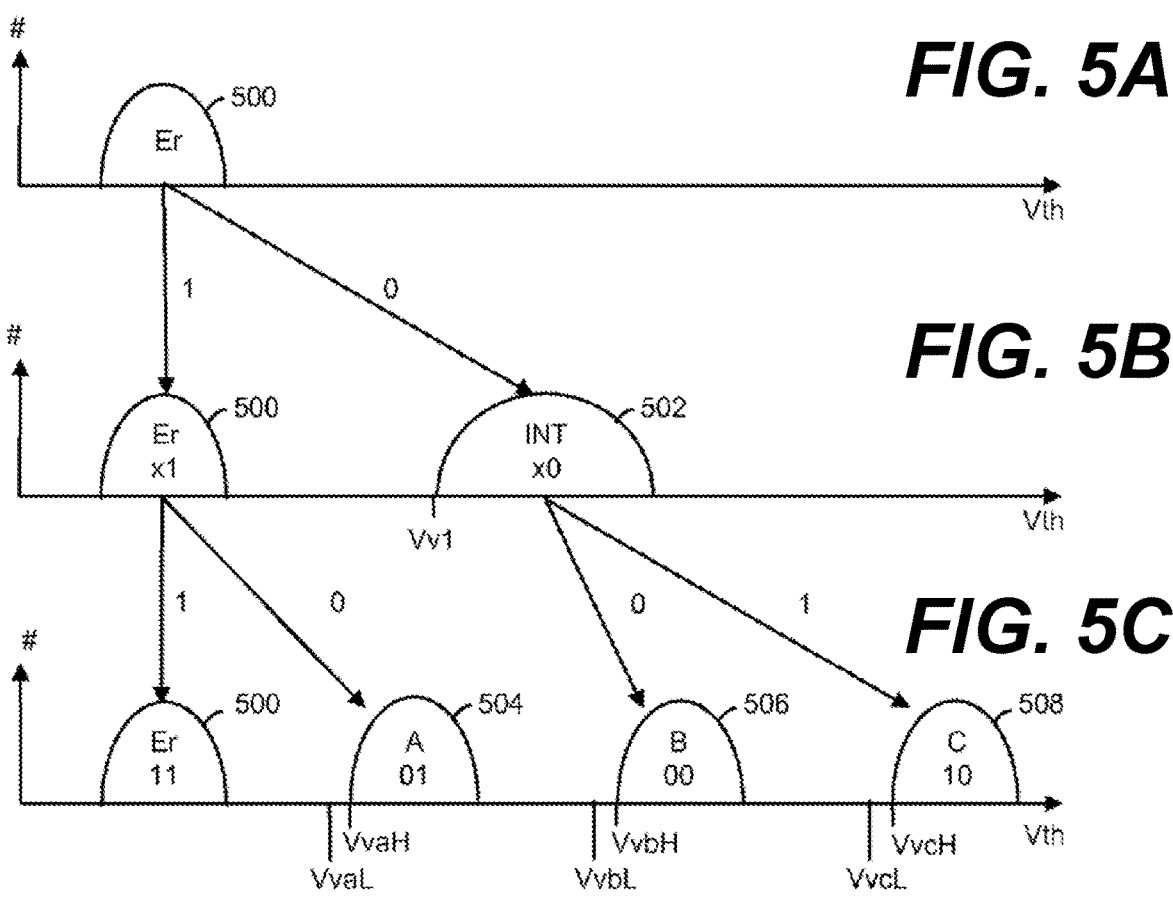
*FIG. 5A*
*FIG. 5B*
*FIG. 5C*

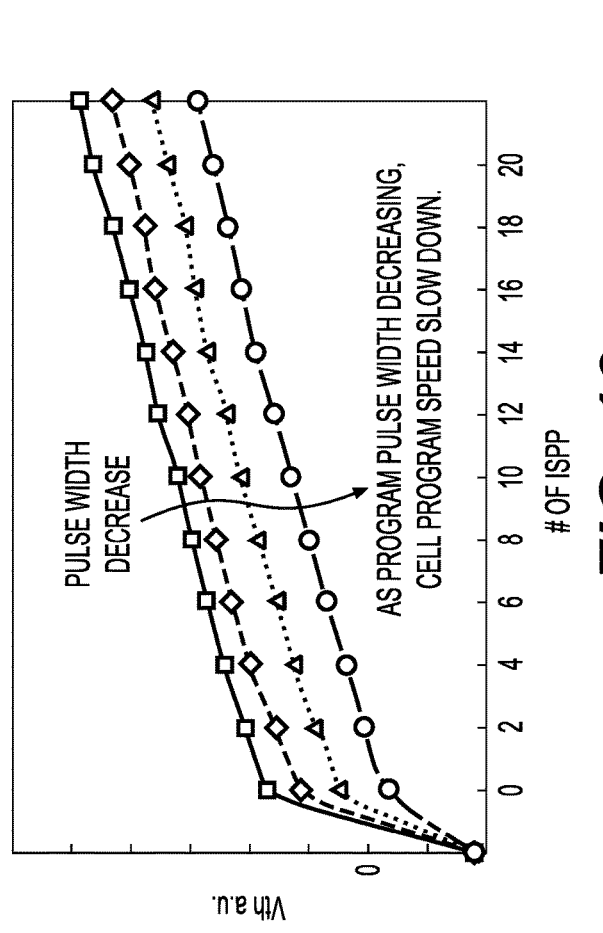

PULSE WIDTH DECREASE

AS PROGRAM PULSE WIDTH DECREASING, CELL PROGRAM SPEED SLOW DOWN.

OF ISPP

Vth a.u.

FIG. 13

| CELL TYPE | BL VOLTAGE COMPARISON | | | | |
| | CONVENTIONAL CELL TRACKING QPW | BL TIMING BASED CELL TRACKING QPW | | | |
| | | PHASE_1 | PHASE_2 | PHASE_3 | PHASE_4 |
| PROGRAM CELLS | 0V | 0V | 0V | 0V | 0V |
| QPW1 CELLS | VQPW1 | 0V | 0V | 0V | VDDSA |
| QPW2 CELLS | VQPW2 | 0V | 0V | VDDSA | VDDSA |
| QPW3 CELLS | VQPW3 | 0V | VDDSA | VDDSA | VDDSA |
| INHIBIT CELLS | VDDSA | VDDSA | VDDSA | VDDSA | VDDSA |

FIG. 14

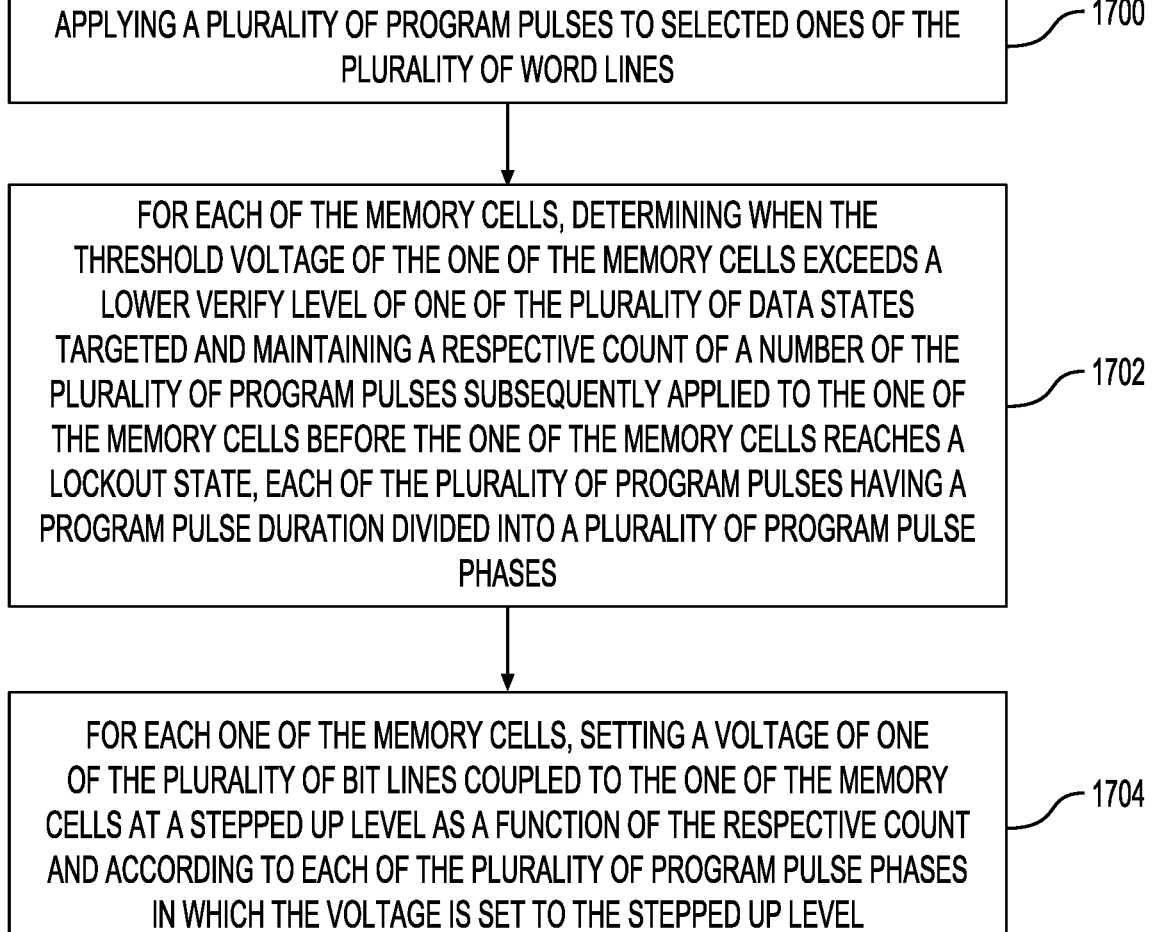

APPLYING A PLURALITY OF PROGRAM PULSES TO SELECTED ONES OF THE PLURALITY OF WORD LINES — 1700

FOR EACH OF THE MEMORY CELLS, DETERMINING WHEN THE THRESHOLD VOLTAGE OF THE ONE OF THE MEMORY CELLS EXCEEDS A LOWER VERIFY LEVEL OF ONE OF THE PLURALITY OF DATA STATES TARGETED AND MAINTAINING A RESPECTIVE COUNT OF A NUMBER OF THE PLURALITY OF PROGRAM PULSES SUBSEQUENTLY APPLIED TO THE ONE OF THE MEMORY CELLS BEFORE THE ONE OF THE MEMORY CELLS REACHES A LOCKOUT STATE, EACH OF THE PLURALITY OF PROGRAM PULSES HAVING A PROGRAM PULSE DURATION DIVIDED INTO A PLURALITY OF PROGRAM PULSE PHASES — 1702

FOR EACH ONE OF THE MEMORY CELLS, SETTING A VOLTAGE OF ONE OF THE PLURALITY OF BIT LINES COUPLED TO THE ONE OF THE MEMORY CELLS AT A STEPPED UP LEVEL AS A FUNCTION OF THE RESPECTIVE COUNT AND ACCORDING TO EACH OF THE PLURALITY OF PROGRAM PULSE PHASES IN WHICH THE VOLTAGE IS SET TO THE STEPPED UP LEVEL — 1704

*FIG. 17*

BIT LINE TIMING BASED CELL TRACKING QUICK PASS WRITE FOR PROGRAMMING NON-VOLATILE MEMORY APPARATUSES

FIELD

This application relates to non-volatile memory apparatuses and the operation of non-volatile memory apparatuses.

BACKGROUND

This section provides background information related to the technology associated with the present disclosure and, as such, is not necessarily prior art.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

However, various challenges are presented in operating such memory devices, for example, accurately programming the threshold voltage ranges. Thus, techniques are needed to overcome such challenges.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide an apparatus including memory cells each connected to one of a plurality of word lines and configured to store a threshold voltage corresponding to one of a plurality of data states. The memory cells are disposed in memory holes each coupled to one of a plurality of bit lines. A control means is coupled to the plurality of word lines and the plurality of bit lines and is configured to apply a plurality of program pulses to selected ones of the plurality of word lines. For each one of the memory cells, the control means is also configured to determine when the threshold voltage of the one of the memory cells exceeds a lower verify level VL of one of the plurality of data states targeted and maintain a respective count of a number of the plurality of program pulses subsequently applied to the one of the memory cells before the one of the memory cells reaches a lockout state. Each of the plurality of program pulses has a program pulse duration divided into a plurality of program pulse phases. For each one of the of the memory cells, the controls means sets a voltage of one of the plurality of bit lines coupled to the one of the memory cells at a stepped up level as a function of the respective count and according to each of the plurality of program pulse phases in which the voltage is set to the stepped up level.

According to another aspect of the disclosure, a controller in communication with a memory apparatus including memory cells each connected to one of a plurality of word lines is provided. The memory cells are configured to store a threshold voltage corresponding to one of a plurality of data states and are disposed in memory holes each coupled to one of a plurality of bit lines. The controller is configured to instruct the memory apparatus to apply a plurality of program pulses to selected ones of the plurality of word lines. For each one of the memory cells, the controller is also configured to instruct the memory apparatus to determine when the threshold voltage of the one of the memory cells exceeds a lower verify level of one of the plurality of data states targeted and maintain a respective count of a number of the plurality of program pulses subsequently applied to the one of the memory cells before the one of the memory cells reaches a lockout state. Each of the plurality of program pulses has a program pulse duration divided into a plurality of program pulse phases. For each one of the of the memory cells, the controller is additionally configured to instruct the memory apparatus to set a voltage of one of the plurality of bit lines coupled to the one of the memory cells at a stepped up level as a function of the respective count and according to each of the plurality of program pulse phases in which the voltage is set to the stepped up level.

According to an additional aspect of the disclosure a method of operating a memory apparatus is provided. The memory apparatus includes memory cells each connected to one of a plurality of word lines. The memory cells are configured to store a threshold voltage corresponding to one of a plurality of data states and are disposed in memory holes each coupled to one of a plurality of bit lines. The method includes the step of applying a plurality of program pulses to selected ones of the plurality of word lines. The method continues with the step of for each one of the memory cells, determining when the threshold voltage of the one of the memory cells exceeds a lower verify level of one of the plurality of data states targeted and maintaining a respective count of a number of the plurality of program pulses subsequently applied to the one of the memory cells before the one of the memory cells reaches a lockout state. Each of the plurality of program pulses has a program pulse duration divided into a plurality of program pulse phases. The method also includes the step of for each one of the of the memory cells, setting a voltage of one of the plurality of bit lines coupled to the one of the memory cells at a stepped up level as a function of the respective count and according to each of the plurality of program pulse phases in which the voltage is set to the stepped up level.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 3B is a block diagram depicting a set of three data latches as an alternative to the set of four data latches depicted in FIG. 3A according to aspects of the disclosure;

FIG. 3C is a block diagram depicting a set of five data latches as an alternative to the set of four data latches depicted in FIG. 3A according to aspects of the disclosure;

FIG. 3D is a block diagram depicting a set of two data latches as an alternative to the sets of four data latches depicted in FIG. 3A according to aspects of the disclosure;

FIGS. 4A and 4B depict a one pass program operation with fast and slow programming modes according to aspects of the disclosure;

FIGS. 5A to 5C depict a two pass program operation with fast and slow programming modes used on the second pass according to aspects of the disclosure;

Figure 8A:
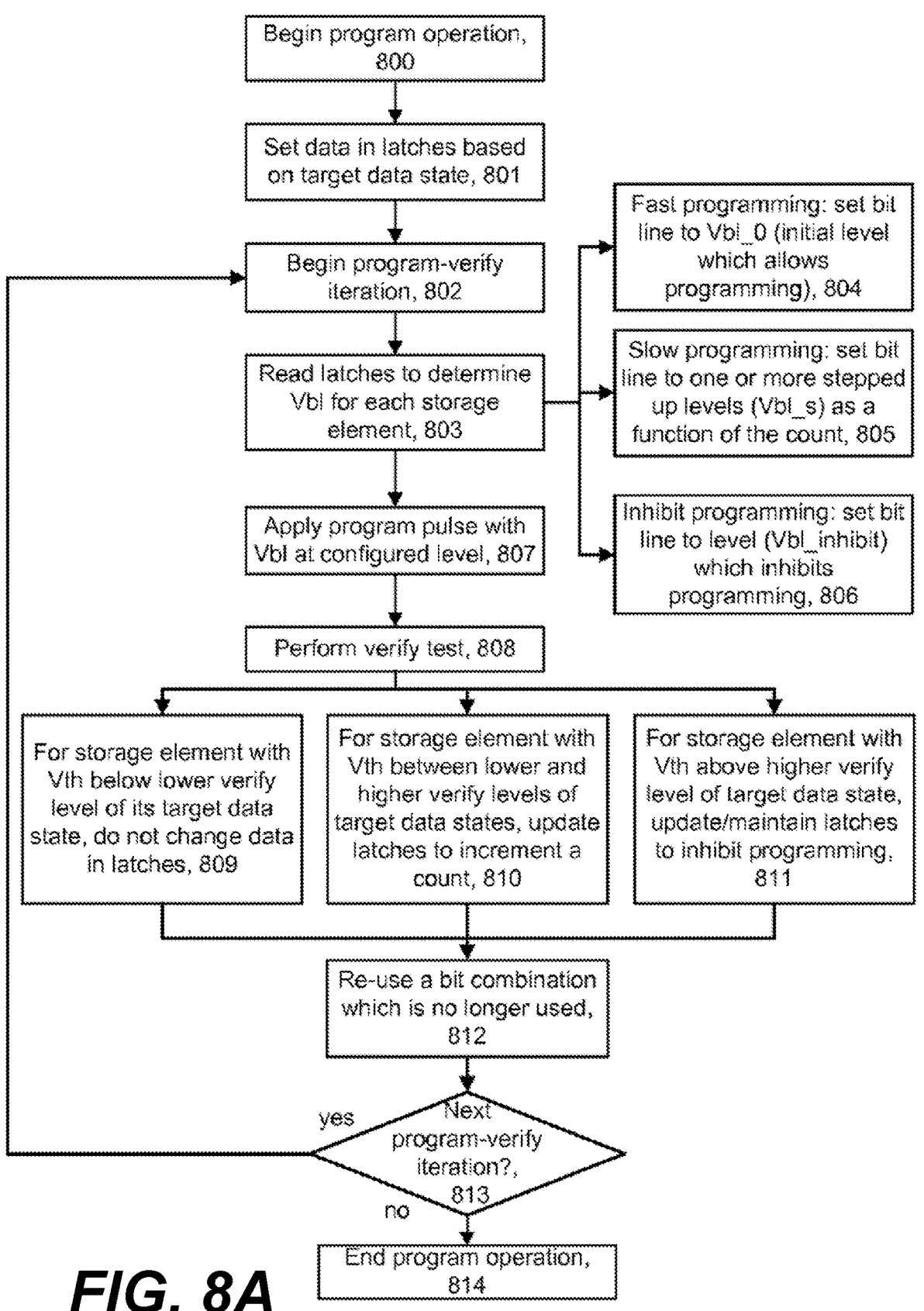
FIG. 8A depicts a program operation in which fast and slow programming modes are used, and a bit line voltage is used in the slow programming mode as a function of a count of program pulses in the slow programming mode according to aspects of the disclosure.
Figure 8B:
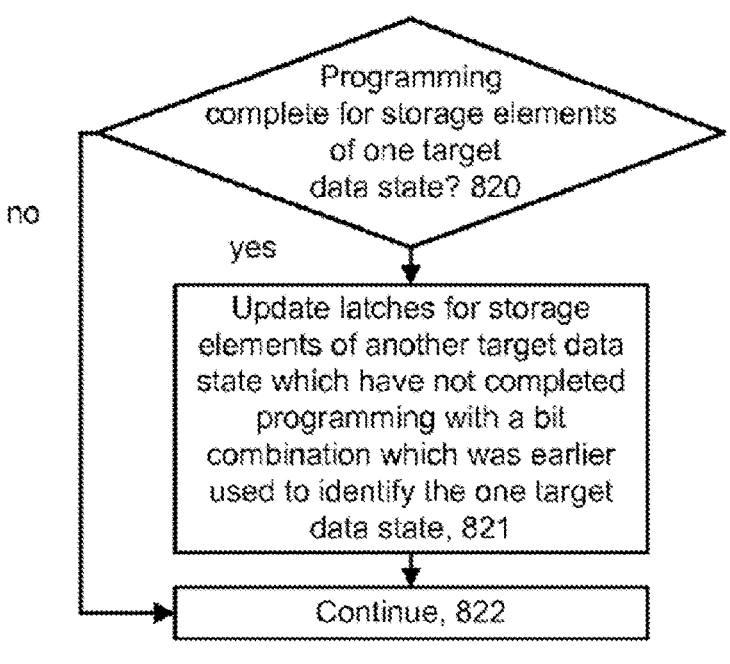
Figure 8C:
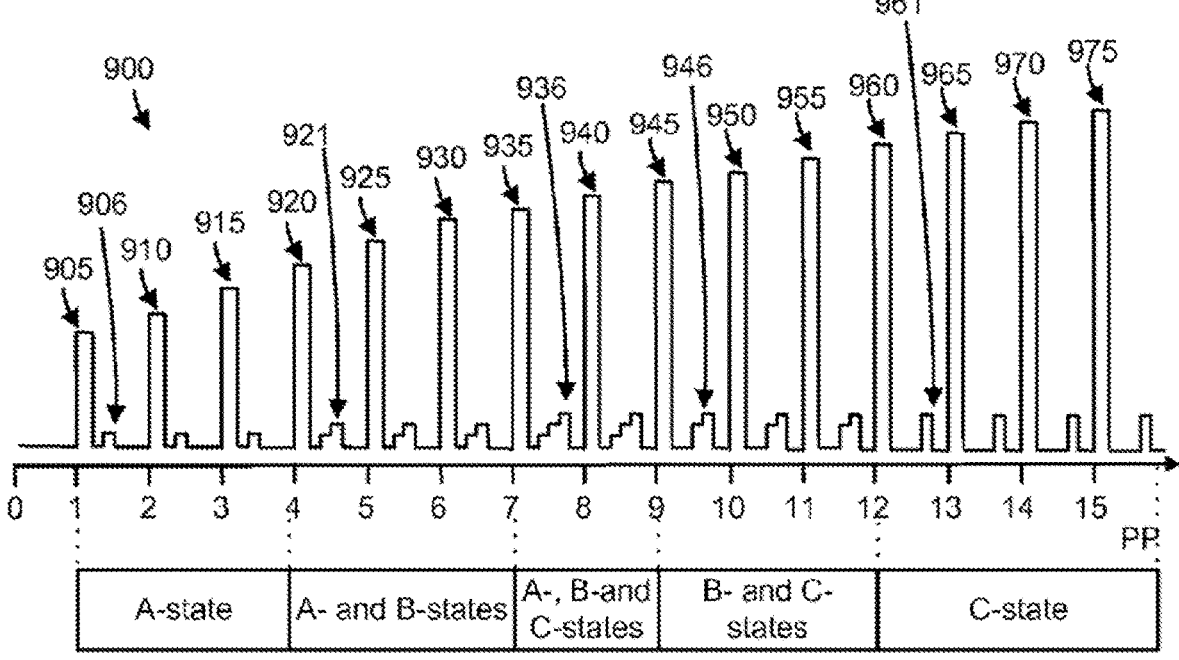
Figures 9A, 9B, 9C, 9D:
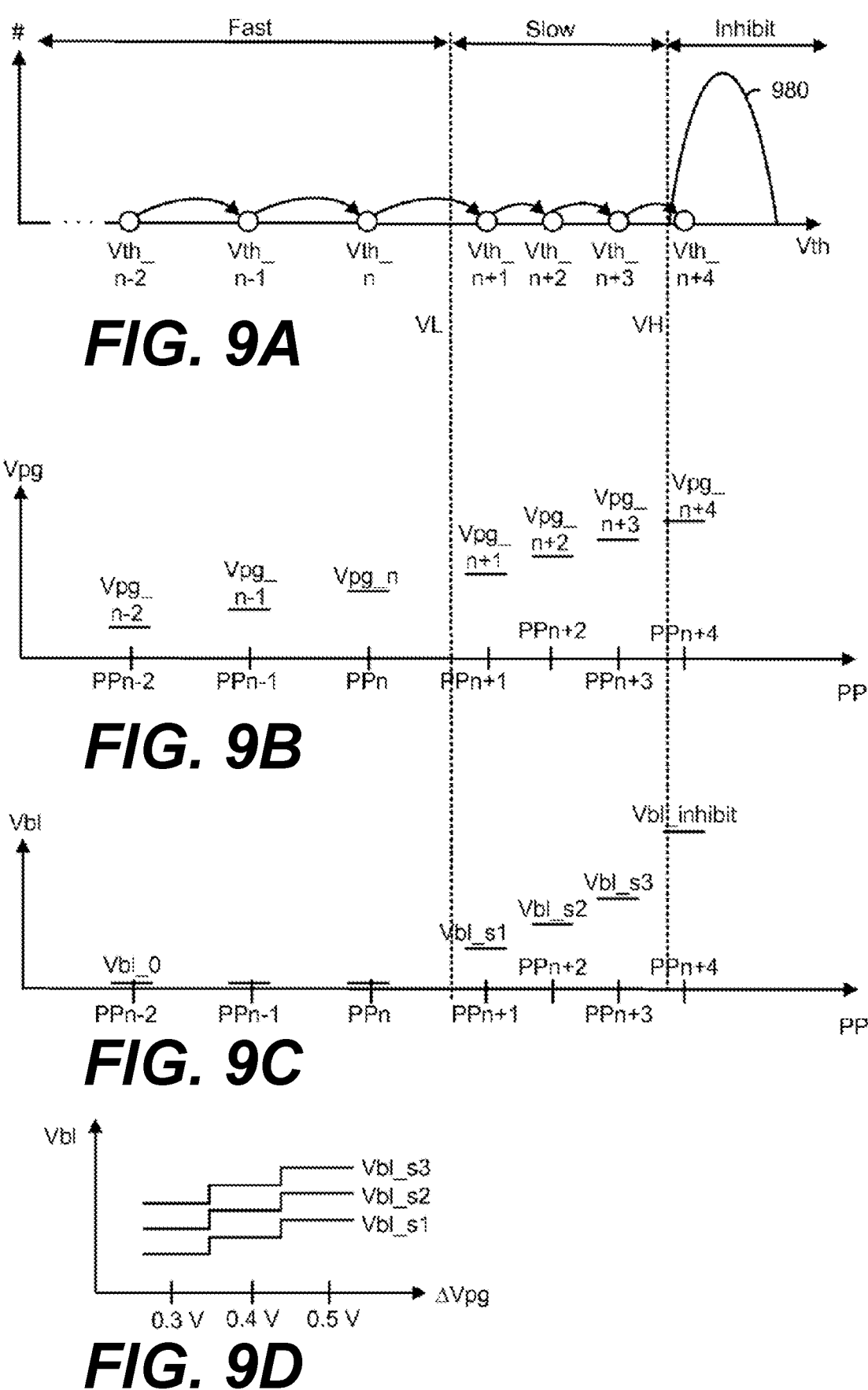
Figures 10, 11:
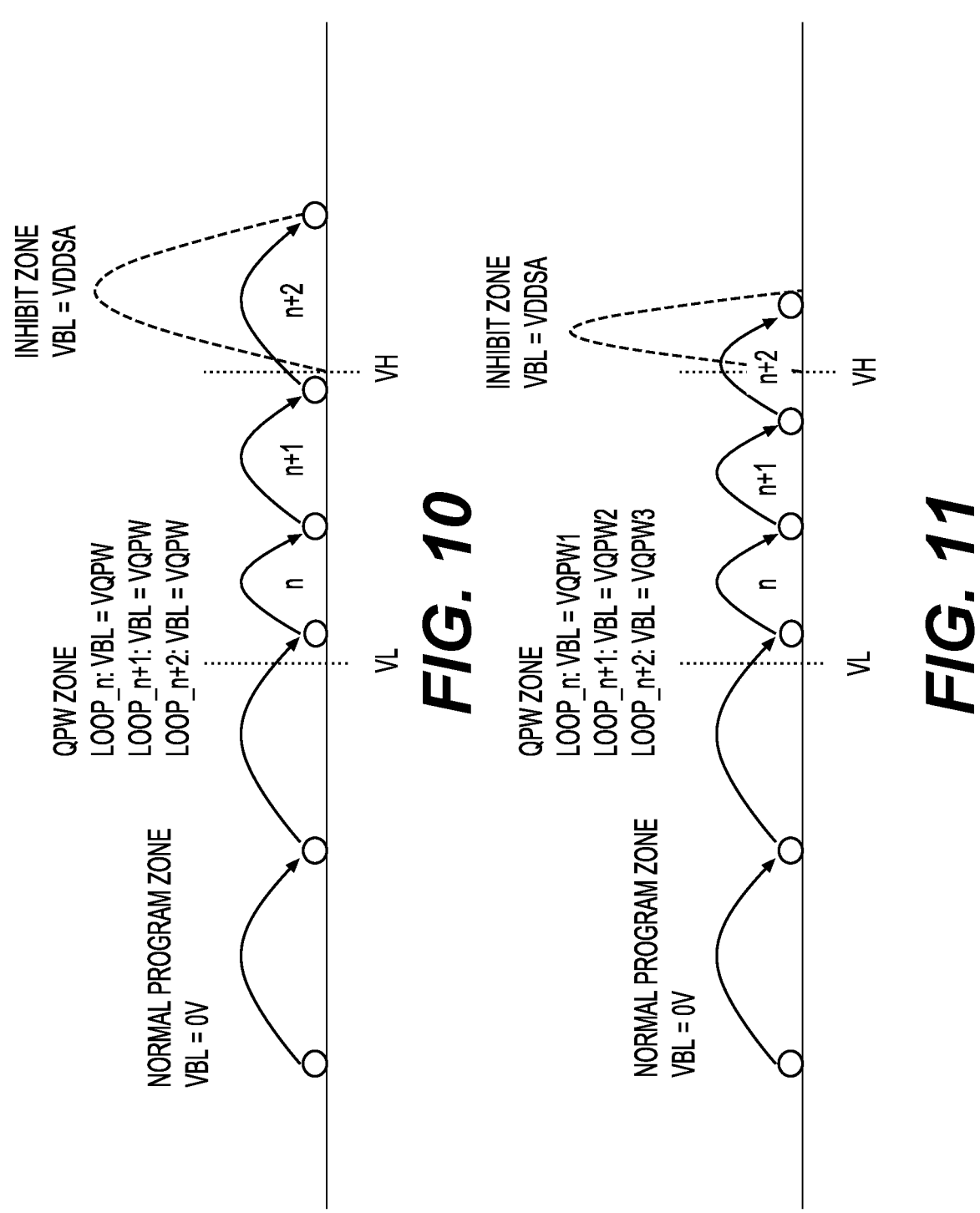
Figure 12:
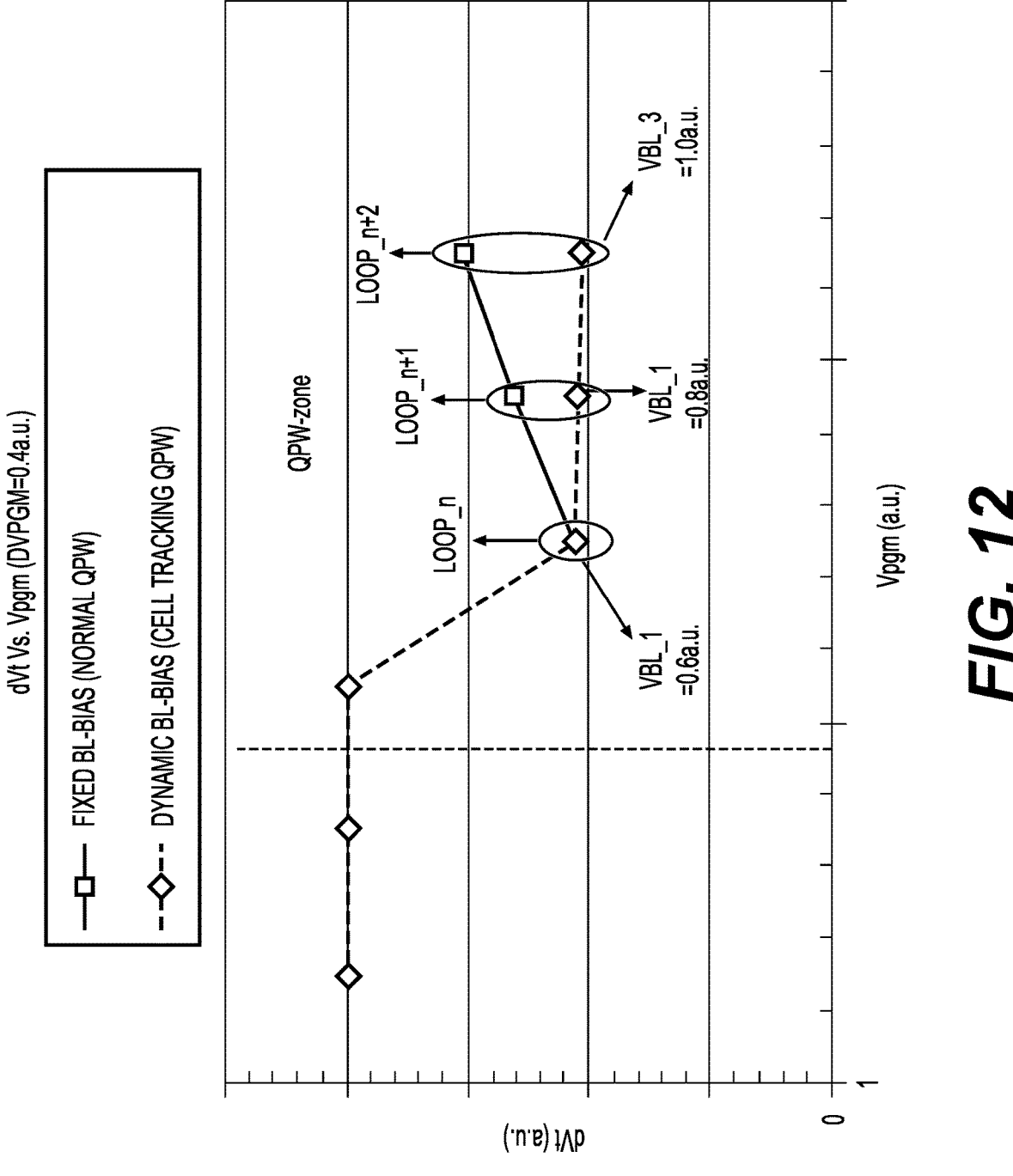
Figures 15, 16:
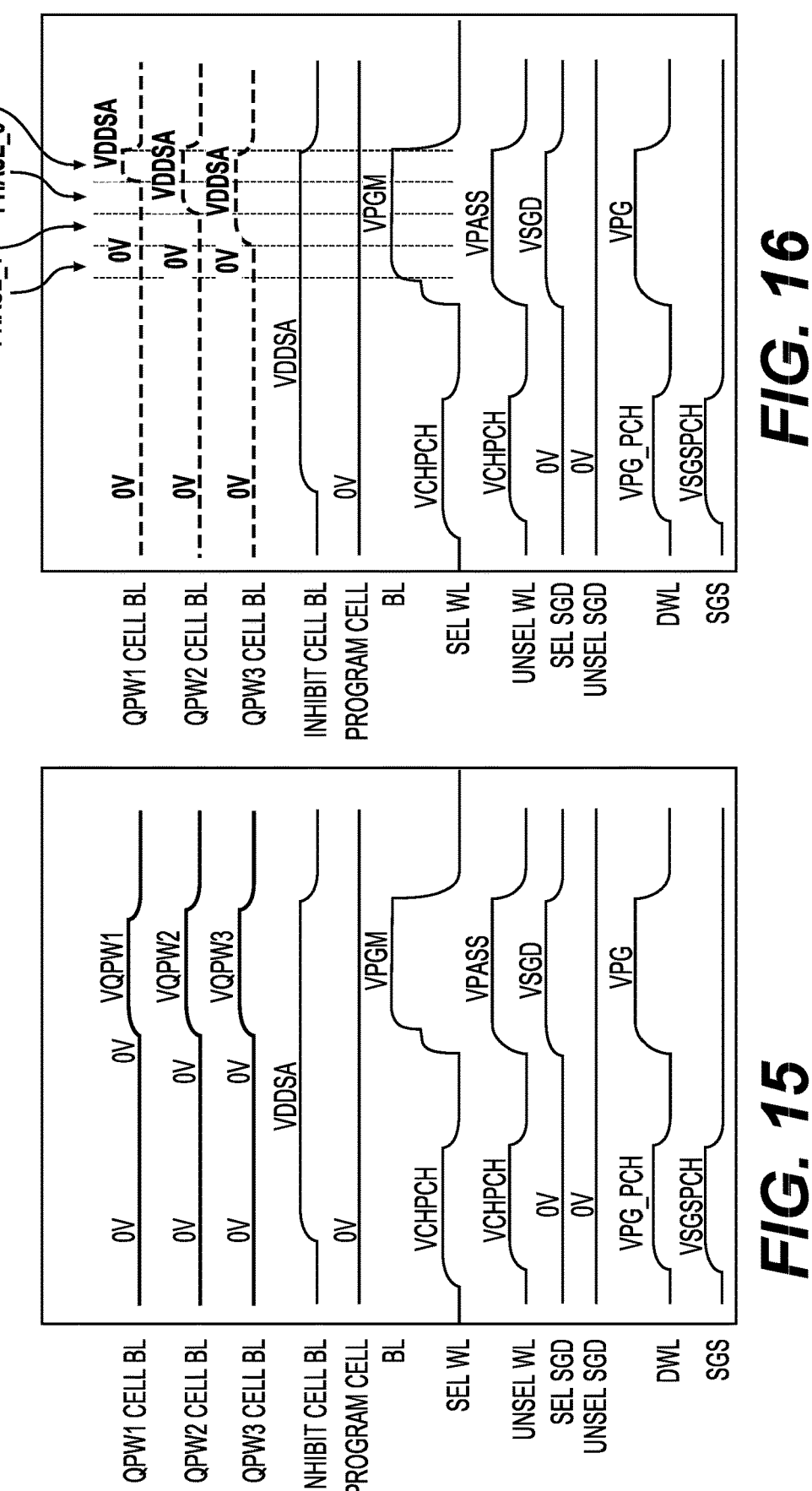

FIG. 8B provides example details regarding step 812 of FIG. 8A in which a bit combination is re-used in data latches to provide an additional count of program pulses in the slow programming mode according to aspects of the disclosure;

FIG. 8C depicts a program operation in which verify operations are performed for different target data states as the program operation progresses, and where a bit combination can be re-used according to the programming progress according to aspects of the disclosure;

FIG. 9A depicts a progress of a Vth of a storage element in a program operation where fast and slow programming modes are used, as a result of the program voltage depicted in FIG. 9B and the bit line voltage depicted in 9C, where different bit line voltages Vbl_s1, Vbl_s2 and Vbl_s3 having a common step size are used during a slow programming mode as a function of a count of program pulses in a slow programming mode according to aspects of the disclosure;

FIG. 9D depicts a variation in the bit line voltages used in the slow programming mode of FIG. 9C as a function of the step size according to aspects of the disclosure;

FIG. 10 shows the memory cell threshold voltage movement when the bit line bias applied to bit lines during the program operation in a "quick pass write" (QPW) zone is fixed according to aspects of the disclosure;

FIG. 11 shows the memory cell threshold voltage movement when the bit line bias applied to bit lines during the program operation in the QPW zone is not fixed according to aspects of the disclosure;

FIG. 12 shows a plot of a change in threshold voltage versus a program voltage for a fixed bit line bias and a dynamic or varying bit line bias according to aspects of the disclosure;

FIG. 13 shows a plot of threshold voltages of example memory cells in each of a plurality of program pulses for various widths of the program pulses according to aspects of the disclosure;

FIG. 14 shows the bit line voltage comparison of a bit line timing based cell tracking QPW versus the conventional cell tracking QPW for each type of memory cells according to aspects of the disclosure;

FIG. 15 shows the voltages applied to various bit lines and word lines along with the associated timing for the conventional cell tracking QPW according to aspects of the disclosure;

FIG. 16 shows the voltages applied to various bit lines and word lines along with the associated timing for the bit line timing based cell tracking QPW according to aspects of the disclosure; and FIG. 17 illustrates steps of a method of operating a memory apparatus according to aspects of the disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

During program operations, there is a tradeoff between reducing programming time and achieving narrow threshold voltage (Vth) distributions for the different data states. Programming speed can be increased by using a larger program pulse step size. However, this results in large overshoots past the verify level, causing a wide Vth distribution. On the other hand, if a smaller program pulse step size is used, a narrow Vth distribution is achieved at the cost of increased programming time. Another approach is to verify the storage elements at two separate verify levels for each target data state. Before the Vth of a storage element reaches a lower verify level VL of its target data state, its bit line voltage (Vbl) is set to a low level such as 0 V to cause the storage element to have a relatively fast programming speed. When the Vth of the storage element exceeds the lower verify level VL, its Vbl is set to an intermediate level to cause the storage element to have a relatively slow programming speed. When the Vth of the storage element exceeds a higher verify level VH of its target data state, its Vbl is set to a high level to inhibit (lockout) programming of the storage element.

Moreover, with Vbl=0 V, the Vth of a storage element increases with each program pulse by an amount which is roughly equal to a step size of the program pulse. With the intermediate Vbl, the Vth of a storage element increases with each program pulse by an amount which is less than the step size of the program pulse. The distance between the lower and higher verify level VHs for each state can be optimized on silicon and set to the point at which the Vth distributions are narrowest. In addition, various magnitudes of the intermediate Vbl may be utilized, depending on how many program loops that have occurred after the threshold voltage of the memory cells is above the lower verify level VL. Instead of varying the magnitude of the bit line voltage Vbl or intermediate Vbl, the time during which the intermediate Vbl is applied may be varied.

Figure 1:
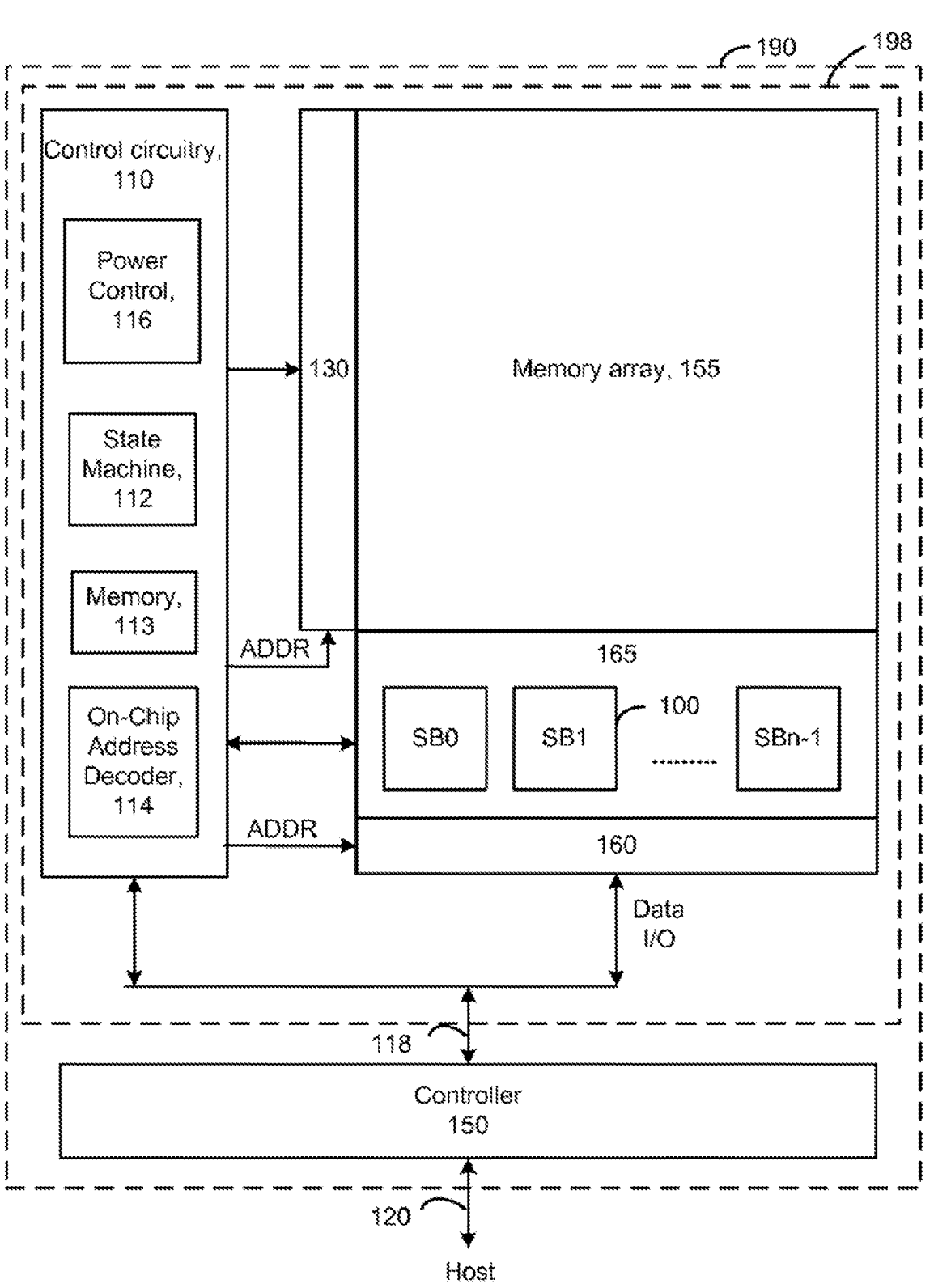
FIG. 1 is a block diagram of a non-volatile memory system using single row/column decoders and read/write circuits according to aspects of the disclosure.

FIG. 1 is a block diagram of a non-volatile memory system using single row/column decoders and read/write circuits. The diagram illustrates a memory device 190 having read/write circuits for reading and programming a page of storage elements in parallel, according to one embodiment. Memory device 190 may include one or more memory die 198. Memory die 198 includes a two-dimensional memory array 155 of storage elements, control circuitry 110, and read/write circuits 165.

In some embodiments, the array of storage elements can be three dimensional. The memory array 155 is addressable by word lines via a row decoder 130 and by bit lines via a column decoder 160. The read/write circuits 165 include multiple sense blocks 100 and allow a page of storage elements to be read or programmed in parallel. Typically a controller 150 is included in the same memory device 190 (e.g., a removable storage card) as the one or more memory die 198. Commands and data are transferred between the host and controller 150 via bus 120 and between the controller and the one or more memory die 198 via lines 118.

The control circuitry 110 cooperates with the read/write circuits 165 to perform memory operations on the memory array 155, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 130 and 160. The power control module 116 controls the power and voltages supplied to the word lines and bit lines during memory operations. A memory 113 can store original write data, modified write data and status bits for use by the state machine as discussed further below.

In some implementations, some of the components of FIG. 1 can be combined. In various designs, one or more of the components (alone or in combination), other than memory array 155, can be thought of as a managing or control circuit. For example, one or more control circuits may include any one of, or a combination of, control circuitry 110, state machine 112, decoders 114/160, power control module 116, sense blocks 100 (including the processor 192 and managing circuit MC0 in FIG. 3A), read/write circuits 165, and controller 150, and so forth. The sense block 100 is discussed further in connection with FIG. 3A.

In another embodiment, a non-volatile memory system uses dual row/column decoders and read/write circuits. The various peripheral circuits access opposite sides of the memory array 155 so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 155. In this way, the density of the read/write modules is essentially reduced by one half.

Figure 2A:
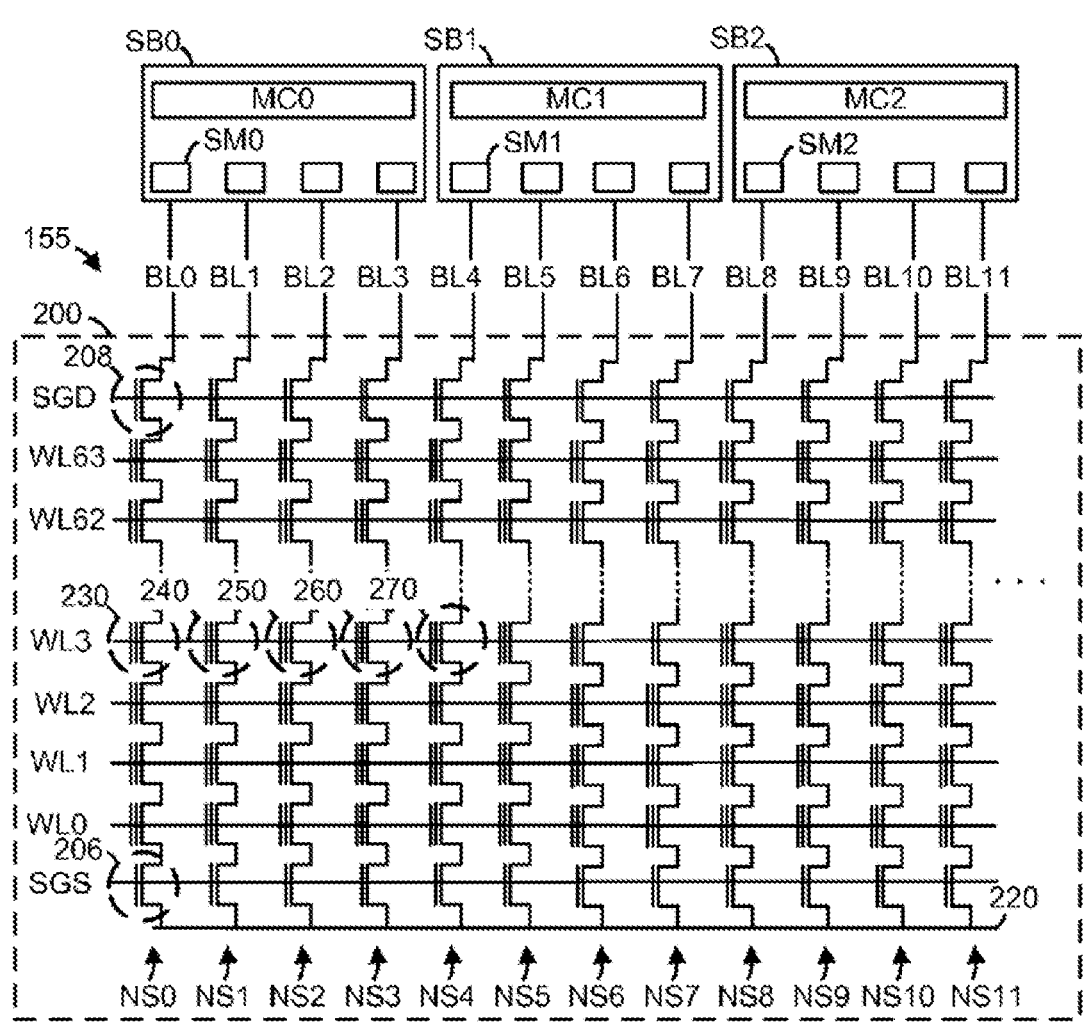
FIG. 2A depicts a block of NAND flash memory cells in the memory array of FIG. 1 and associated sense blocks SB0, SB1 and SB2 according to aspects of the disclosure.

FIG. 2A depicts a block of NAND flash memory cells in the memory array 155 of FIG. 1 and associated sense blocks SB0, SB1 and SB2. The memory array can include many blocks. An example block 200 includes a number of NAND strings NS0 to NS11 and respective bit lines, e.g., BL0 to BL11, which are shared among the blocks. Each NAND string is connected at one end to a drain select gate (SGD), and the control gates of the drain select gates are connected via a common SGD line. Each NAND string is connected at its other end to a source select gate which, in turn, is connected to a common source line 220. For example, NS0 includes a source side select gate transistor 206 and a drain side select gate transistor 208. Example storage elements 230, 240, 250, 260 and 270 are in NS0 to NS4, respectively, and are connected to WL3. For example, WL3 could be a selected word line which is selected for programming and the example storage elements can be selected storage elements which are selected for programming. Other storage elements connected to WL3 can also be selected storage elements. Sixty-four word lines, for example, WL0-WL63, extend between the source-side select gates and the drain-side select gates.

In one approach, one sense block is provided for a group of NAND strings, such as four NAND strings. For example, SB0 is associated with BL0-BL3, SB1 is associated with BL4-BL7 and SB2 is associated with BL8-BL11. Each sense block includes a memory controller, e.g., MC0, MC1 and MC2 in SB0, SB1 and SB2, respectively. Each sense block also includes a sense module for each NAND string. Representative sense modules SM0, SM1 and SM2 are depicted in SB0, SB1 and SB2, respectively. SB0 and MC0 are discussed further in connection with FIG. 3A.

Other types of non-volatile memory in addition to NAND flash memory can also be used. For example, another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the Vth of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor. Another type of memory uses a metallic (conductive) charge storage element in a NAND architecture.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 2B:
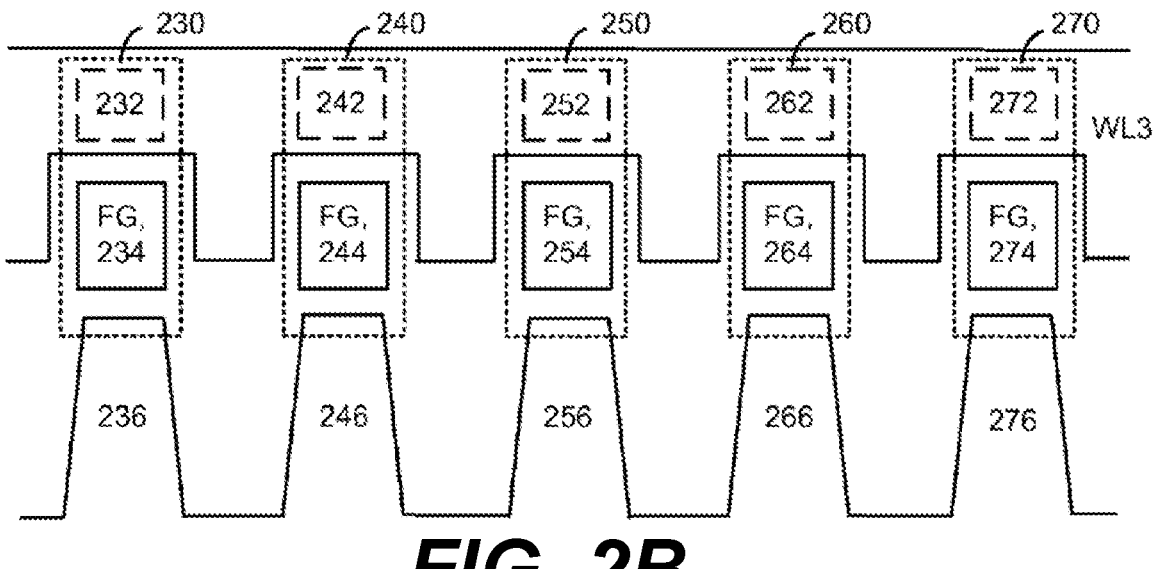
FIG. 2B depicts a cross-sectional view of the NAND strings of FIG. 2A according to aspects of the disclosure.

FIG. 2B depicts a cross-sectional view of the NAND strings of FIG. 2A. A bit line or NAND string direction goes into the page, and a word line direction goes from left to right. As an example, WL3 extends across NAND strings NS0 to NS4 which include respective channel regions 236, 246, 256, 266 and 276. The storage element 230 in NS0 includes a control gate 232, a floating gate 234 and the channel region 236. The storage element 240 in NS1 includes a control gate 242, a floating gate 244 and the channel region 246. The storage element 250 in NS2 includes a control gate 252, a floating gate 254 and the channel region 256. The storage element 260 in NS3 includes a control gate 262, a floating gate 264 and the channel region 266. The storage element 270 in NS4 includes a control gate 272, a floating gate 274 and the channel region 276.

Figure 3A:
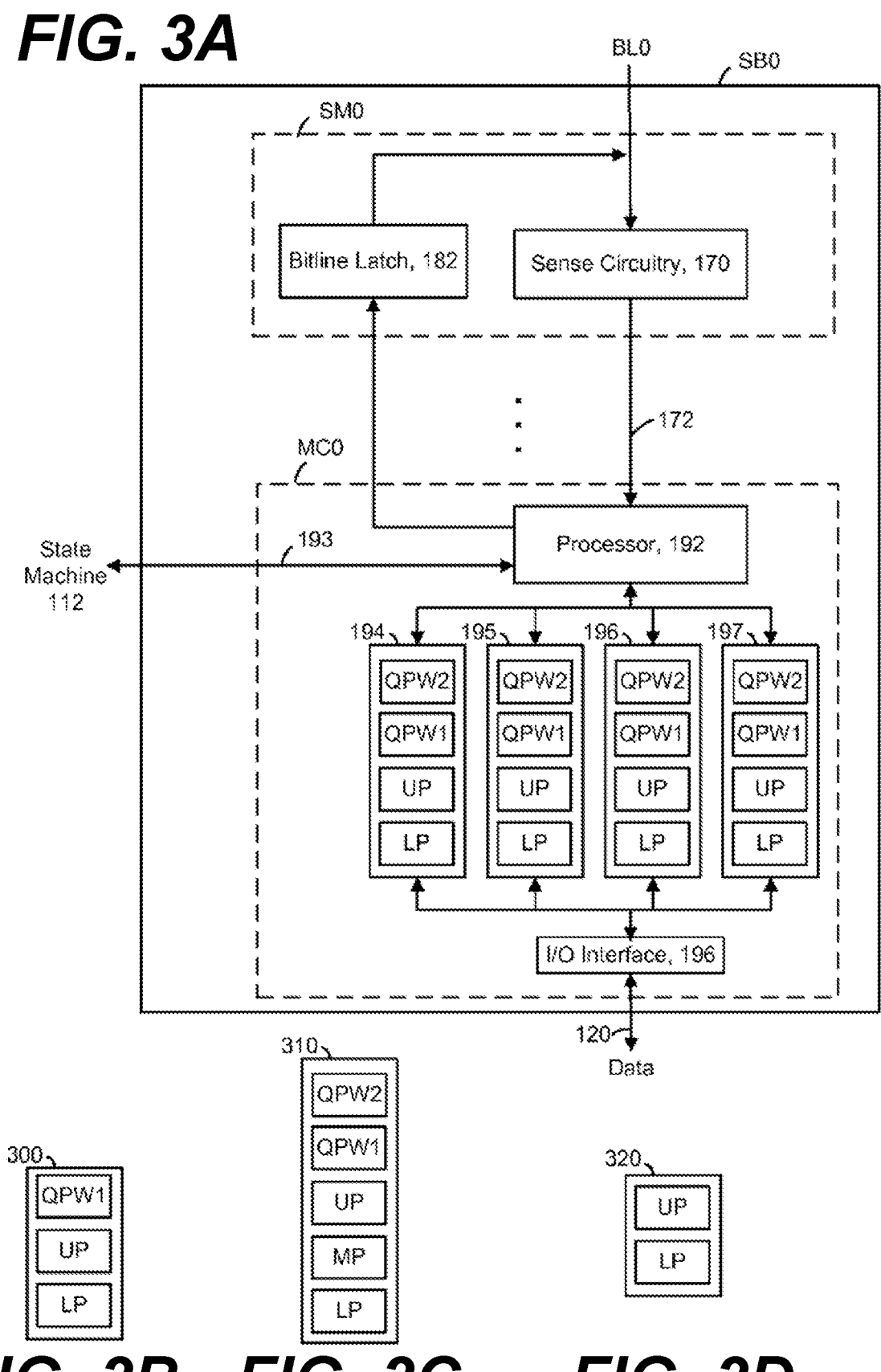
FIG. 3A is a block diagram depicting one embodiment of the sense block SB0 of FIG. 1 according to aspects of the disclosure.

FIG. 3A is a block diagram depicting one embodiment of the sense block SB0 of FIG. 1. The individual sense block SB0 is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of multiple, e.g., four or eight, sense modules. Each of the sense modules in a group communicates with the associated managing circuit via a data bus 172. Thus, there are one or more managing circuits which communicate with the sense modules of a set of storage elements.

The sense module SM0 comprises sense circuitry 170 that performs sensing by determining whether a conduction current in a connected bit line is above or below a predetermined threshold level. SM0 includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, flag=0 can inhibit programming, while flag=1 allows programming.

Managing circuit MC0 comprises a processor 192, four example sets of data latches 194-197 and an I/O Interface 196 coupled between the set of data latches 194 and data bus 120. One set of data latches can be provide for each sense module, and data latches identified by LP, UP, QPW1 and QPW2 may be provided for each set. In some cases, additional data latches may be used. In other cases, fewer data latches may be used. LP stores a bit for a lower page of data, and UP stores a bit for an upper page of data. This is in a four-level or two-bits per storage element memory device. In each set of latches, one or more additional data latches, each storing one bit of data, can be provided to maintain a count of program pulses which are applied to the storage element when its Vth is between the lower and higher verify level VHs, e.g., when the storage element experiences slow programming. In this example, two additional data latches QPW1 and QPW2 are depicted.

Processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of the state machine 112 that controls the supply of different control gate voltages to the addressed storage element. As it steps through the various predefined control gate voltages corresponding to the various memory states supported by the memory, the sense module may trip at one of these voltages and a corresponding output will be provided from sense module to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit MC0, bit line latch 182 serves double duty, both as a latch for latching the output of the sense module and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LP and UP latches, in a two-bit per storage element implementation. In a three-bit per storage element implementation, one extra data latch MP may be used, to store the middle page data. The program operation, under the control of the state machine, comprises a series of programming voltage pulses applied to the control gates of the addressed storage elements. Each program pulse is followed by a read back (verify) to determine if the storage element has been programmed to the desired memory state. In some cases, processor 192 monitors the read back memory state relative to the desired memory state. When the two states agree, the processor 192 sets the bit line latch 182 to cause the bit line to be pulled to a state designating program inhibit. This inhibits the storage element coupled to the bit line from further programming even if program pulses appear on its control gate. In other embodiments, the processor initially loads the bit line latch 182 and the sense circuitry sets it to an inhibit value during the verify process.

Each set of data latches 194-197 may be implemented as a stack of data latches for each sense module. In one embodiment, there are three data latches per sense module. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

The data latches identify when an associated storage element has reached certain mileposts in a program operation. For example, latches may identify that the Vth of a storage element is below a particular verify level. The data latches indicate whether a storage element currently stores one or more bits from a page of data. For example, the LP latches can be used to store a lower page of data. An LP latch is flipped (e.g., from 0 to 1) when a lower page bit is stored in an associated storage element. The UP latches can be used to store an upper page of data, for instance. An UP latch is flipped when an upper page bit is stored in an associated storage element. The flipping of a bit occurs when an associated storage element completes programming, e.g., when its Vth exceeds a target verify level such as VvaH, VvbH or VvcH. When lower, middle and upper page bits are used (e.g., in case of three-bit per storage element memory), they are stored in latches referred to as LP, MP and UP, respectively. MP is flipped when a middle page bit is stored in an associated storage element, and UP is flipped when an upper page bit is stored in an associated storage element. For example, in FIG. 6B to 6D, the first bit (from right to left) is the lower page bit, the second bit is the middle page bit and the third bit is the upper page bit.

FIG. 3B is a block diagram depicting a set of three data latches as an alternative to the set of four data latches depicted in FIG. 3A. The set 300 includes latches LP, UP and QPW1. This arrangement is discussed also in connection with FIGS. 8B, 14A and 14B.

FIG. 3C is a block diagram depicting a set of five data latches as an alternative to the set of four data latches depicted in FIG. 3A. The set 310 includes latches LP, MP, UP, QPW1 and QPW2.

FIG. 3D is a block diagram depicting a set of two data latches as an alternative to the sets of four data latches depicted in FIG. 3A. The set 320 includes latches LP and UP.

FIGS. 4A and 4B depict a one pass program operation with fast and slow programming modes. One pass programming is also referred to as "one-pass write" programming. A programming pass is generally meant to encompass a sequence of multiple program-verify operations which are performed starting from an initial Vpg level and proceeding to a final Vpg level until the threshold voltages of a set of selected storage elements reach one or more respective verify levels of respective target data states. In one pass programming, all storage elements are initially in an erased state. Some of the storage elements are not programmed and remain in the erased state while others are programmed to higher target data states.

Example Vth distributions for the storage element array are provided for a case where each storage element stores two bits of data. Each graph depicts Vth on the horizontal axis and a number or population of storage elements in a Vth distribution on the vertical axis. One bit represents the LP data and the other bit represents the UP data. A bit combination can be denoted by the UP bit followed by the LP bit, e.g., 11 denotes UP=1 and LP=1, 01 denotes UP=0 and LP=1, 00 denotes UP=0 and LP=0 and 10 denotes UP=1 and LP=0. A first Vth distribution 400 is provided for erased (Er) state storage elements. Three Vth distributions 404, 406 and 408 represent target data states A, B and C, respectively, which are reached by storage elements when their Vth exceeds a higher verify level VH VvaH, VvbH or VvcH, respectively. In this case, each storage element can store two bits of data in one of four possible Vth ranges, referred to as states Er, A, B and C. A program option which uses a slow programming mode may be referred to as a "quick pass write" (QPW) technique. QPW can be used independently in one or more passes of a multiple pass programming technique. Although, generally, it is sufficient to use QPW in the final programming pass when accuracy is most important. QPW mode and slow programming mode are used interchangeably herein.

When QPW is used, lower verify level VLs (VvaL, VvbL or VvcL) are defined such that the storage elements enter a slow down programming mode or zone (e.g., by raising the associated bit line voltages applied during program) when their Vth is between the lower verify level VL and the higher verify level VH of a respective target data state. The lower verify level VLs are offset below the respective higher verify level VHs, in one implementation. Specifically, when a verify test determines that the Vth of a storage element exceeds the lower verify level VL associated with the target data state of the storage element, a slow programming mode begins for the storage element. Subsequently, when a verify test determines that the Vth of a storage element exceeds the higher verify level VH associated with the target data state of the storage element, the storage element is locked out from further programming.

In some cases, QPW is used on fewer than all target data states. For example, a wider Vth distribution may be acceptable for the highest data state (e.g., the C state in this example). Total programming time may be reduced by avoiding the use of QPW with the highest data state, since the time spent in sensing whether the Vth exceeds VvcL can be avoided. Generally, QPW can be used for selected target data states based on testing which identifies the target data states for which QPW yields the most benefit.

The specific relationship between the data programmed into a storage element and the Vth level of the storage element depends upon the data encoding scheme adopted for the storage elements. In one embodiment, data values are assigned to the Vth ranges using a Gray code assignment so that if the Vth of a floating gate erroneously shifts to its neighboring physical state, only one bit will be affected. One example assigns "11," "01," "00" and "10" to the E, A, B and C state. Read reference voltages which are between the distributions are used for reading data from the storage elements. By testing whether the Vth of a given storage element is above or below one or more of the read reference voltages, the system can determine the data state which is represented by a storage element.

FIGS. 5A to 5C depict a two pass program operation with fast and slow programming modes used on the second pass, and only fast programming mode used on the first pass. Each pass can be used to program a page of data. For example, programming of lower and upper pages in two-bit, four-level storage elements is provided. Programming can be performed one logical page at a time, with the lower page followed by the upper page. Initially, all storage elements are in the Er state, represented by the distribution 500 in FIG. 5A.

FIG. 5B depicts programming of a lower page of data. If the lower page has a bit=1, the associated storage element remains in the distribution 500 and the data is represented by x1, where x is an upper page bit that is not yet known. If the lower page has a bit=0, the storage element is programmed to a higher Vth as represented by distribution 502, which is an interim distribution (INT), using a verify level Vv1. The data of these storage elements is represented by x0. Note that the interim distribution can be relatively wide since it is not a final distribution and does not represent a final data state.

FIG. 5C depicts programming of an upper page of data. If UP/LP=11, the associated storage element in the distribution 500 remains in the distribution 500 and stores data bits 11. If UP/LP=01, the storage elements in the distribution 500 are programmed to the distribution 504 (state A) and a slow down programming mode is used when the Vth is between VvaL VvaH. If UP/LP=10, the storage elements in the distribution 502 are programmed to the distribution 508 (state C) and a slow down programming mode is used when the Vth is between VvcL and VvcH. If UP/LP=00, the storage elements in the distribution 502 are programmed to the distribution 506 (state B) and a slow down programming mode is used when the Vth is between VvbL and VvbH.

Programming can be similarly extended to three or more bits per storage element. For example, FIGS. 6A to 6D depict a three pass program operation with fast and slow programming modes used on the third pass. Programming of lower, middle and upper pages in three-bit, eight-level storage elements is depicted. Seven programmed data states A through G are used in addition to Er for eight states total. Initially, all storage elements are in the Er state, represented by the distribution 600. The lower page is programmed in FIG. 6B. If LP=1, storage elements in distribution 600 remain in that distribution. If LP=0, storage elements in distribution 600 are programmed to an interim distribution 602 using Vv1. The middle page is programmed in FIG. 6C. If MP=1, storage elements in distribution 600 remain in that distribution, and storage elements in distribution 602 are programmed to interim distribution 608 using verify level Vv4. If MP=0, storage elements in distribution 600 are programmed to interim distribution 604 using verify level Vv2, and storage elements in distribution 602 are programmed to interim distribution 606 using verify level Vv3.

Figures 6A, 6B, 6C, 6D:
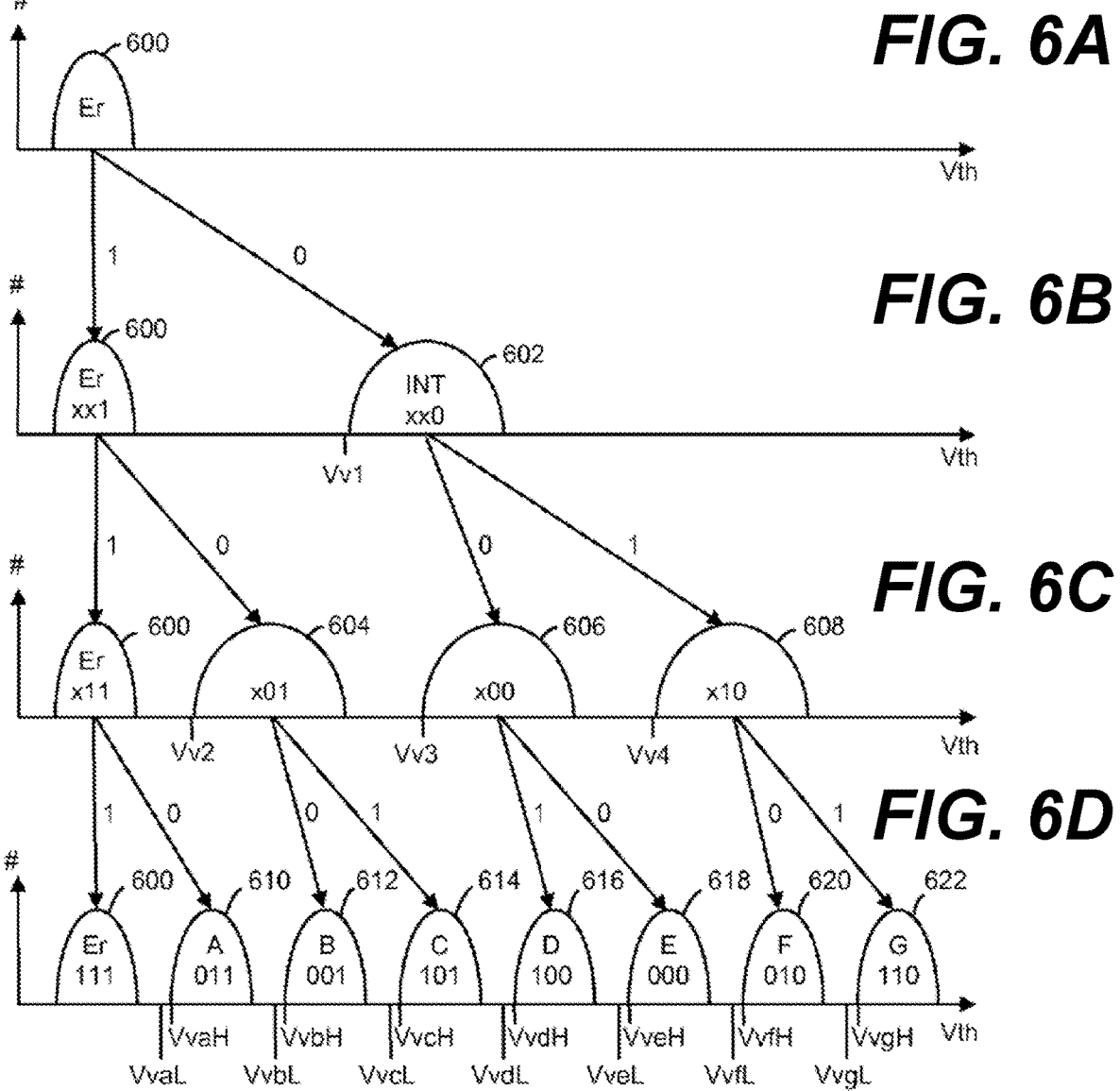
FIGS. 6A to 6D depict a three pass program operation with fast and slow programming modes used on the third pass according to aspects of the disclosure.

The upper page is programmed in FIG. 6D. QPW is used for this pass. If UP=1, storage elements in distribution 600 remain in that distribution, storage elements in distribution 604 are programmed to distribution 614 (state C), storage elements in distribution 606 are programmed to distribution 616 (state D), and storage elements in distribution 608 are programmed to distribution 622 (state G). If UP=0, storage elements in distribution 600 are programmed to distribution 610 (state A), storage elements in distribution 604 are programmed to distribution 612 (state B), storage elements in distribution 606 are programmed to distribution 618 (state E), and storage elements in distribution 608 are programmed to distribution 620 (state F).

Programming using four bits per cell (16 levels) can similarly involve four pages. Additionally, when programming multiple pages of data, a back and forth word line order may be used to reduce potential disturbs from capacitive coupling.

Figures 7A, 7B, 7C:
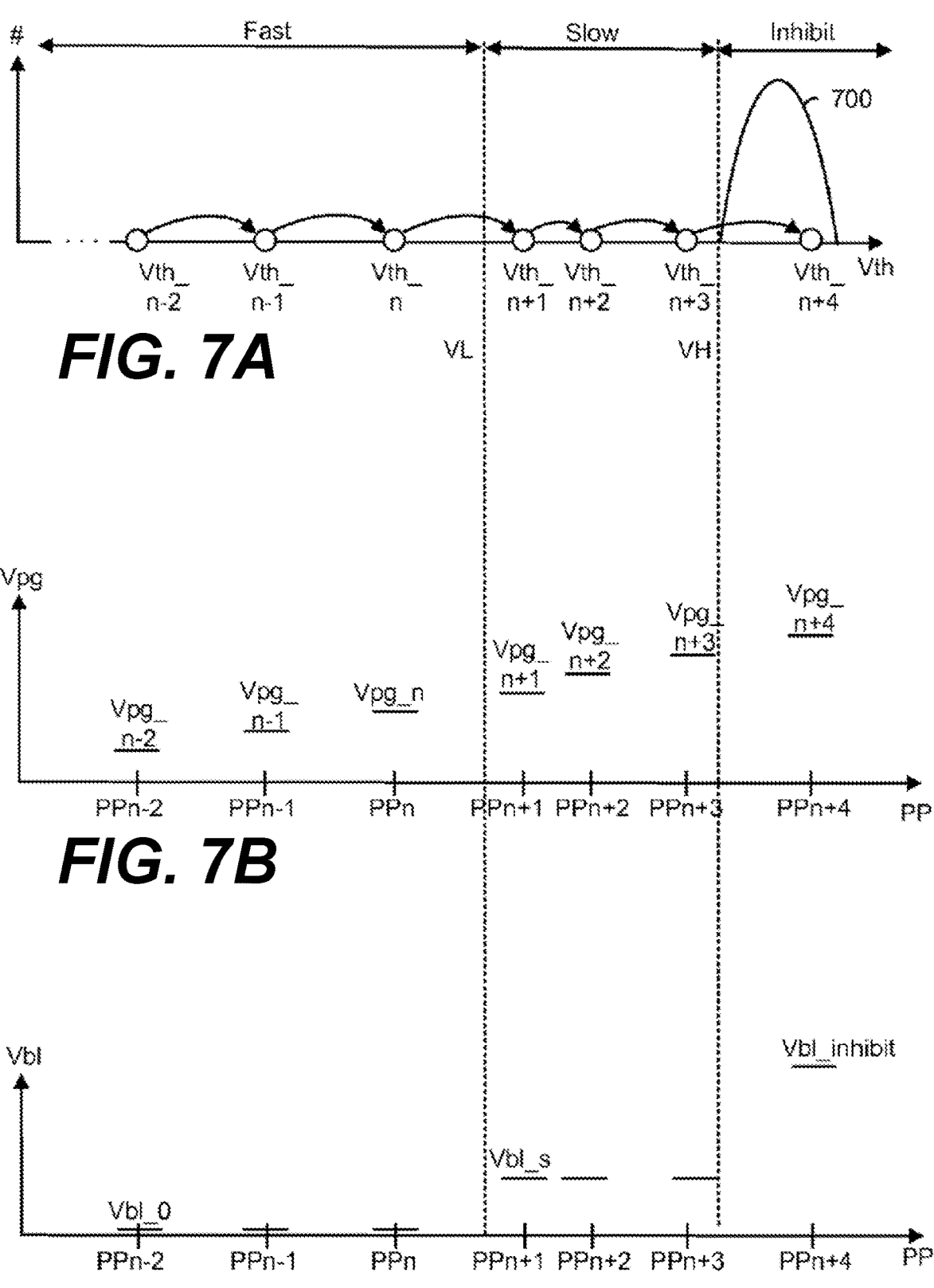
FIG. 7A depicts a progress of a Vth of a storage element in a program operation where fast and slow programming modes are used, as a result of the program voltage depicted in FIG. 7B and the bit line voltage depicted in 7C, where a single bit line voltage is used during the slow programming mode according to aspects of the disclosure.

FIG. 7A depicts a progress of a Vth of a storage element in a program operation where fast and slow programming modes are used, as a result of the program voltage depicted in FIG. 7B and the bit line voltage depicted in 7C, where a single Vbl is used during the slow programming mode. The horizontal axis depicts Vth and the vertical axis depicts a number of cells in the Vth distribution 700. The circles depict the Vth of a storage element when a corresponding program pulse and bit line voltage are applied. A fast programming zone (Fast), slow programming zone (Slow) and inhibit zone (Inhibit) are depicted. In FIG. 7B, the horizontal axis depicts a program pulse number and the vertical axis depicts a corresponding program voltage Vpg. In FIG. 7C, the horizontal axis depicts the program pulse number and the vertical axis depicts a corresponding bit line voltage Vbl.

The fast programming mode is represented by program pulses PPn–2 through PPn, when program voltages Vpg_n–2 through Vpg_n and bit line voltage Vbl-0 (e.g., 0 V) are applied. PPn is the programming pulse which causes the Vth to increase above VL (e.g., from Vth_n to Vth_n+1). Generally, one or more initial program pulses (e.g., PPn–2 to PPn) are applied in the fast programming mode, and one or more additional program pulses (e.g., PPn+1 to PPn+3) are applied in the slow programming mode. Further program pulses such as PPn+4 are applied in the inhibit zone.

In the slow programming mode, program voltages Vpg_n+1 through Vpg_n+3 and bit line voltage Vbl_s (e.g., 0.6 V) are applied, causing the Vth to increase to Vth_n+2 through Vth_n+4, respectively. In the inhibit mode, a program pulse PPn+4 is applied using program voltage Vpg_n+4 and bit line voltage Vbl_inhibit (e.g., 2.5 V), causing no change in the Vth. PPn+3 is the programming pulse which causes the Vth to increase above VH (e.g., from Vth_n+3 to Vth_n+4). Vbl_s is the single bit line voltage which is used during the slow programming mode.

As discussed, the slow programming mode helps to tighten the programmed Vth distributions. In one approach, the slow programming mode can be used for all states except the highest programmed state. For example, it can be used for the A/B states but not the C state when there are four data states, and for the A/B/C/D/E/F-states but not the G state when there are eight data states. Under the slow programming mode, verify tests are performed at Verify_Low (VL) and Verify_High (VH) during programming. VH is the higher or final verify level for a respective data state. Based on the Vth level of a storage element with respect to VL and VH, the bit line associated with the storage element can be biased at different levels to modulate the program speed of the storage element. If Vth<VL, the associated Vbl is set to 0 V, for instance, leading to a normal (fast) program speed. The Vth increases by roughly equal increments in the fast programming mode as represented by Vth_n−1-Vth_n−2, Vth_n-Vth_n−1 and Vth_n+1-Vth_n. Once the Vth of the storage element reaches in between VL and VH (VL<Vth<VH), the associated Vbl is raised to a slow programming level such as 0.6 V to slow down the programming. The storage element takes much smaller Vth jumps in the slow programming mode. The Vth increases by increments as represented by Vth_n+2-Vth_n+1, Vth_n+3-Vth_n+2 and Vth_n+4-Vth_n+3 in the slow programming mode. When Vth>VH for the storage element, it is locked out by setting Vbl to a power supply voltage Vdd (~2.5 V). This high Vbl inhibits the storage element from further programming during subsequent program pulses which are applied to the selected word line.

The process depicted occurs separately for each of the selected storage elements. For example, the number of program pulses (PPn) required to reach the slow programming mode can be different for different storage elements.

An optimum exists for the gap between VL and VH at which the programmed Vth distributions are tightest. To understand why, consider that if the VL to VH gap is too small, the Vth of most storage elements jumps over the gap and hence the slow programming mode is bypassed. On the other hand, if the gap is too large, then multiple program pulses are needed to cause the Vth of the storage element to increase from VL to VH. Since the Vbl applied under the slow programming mode is fixed while Vpg is stepped up at the same pace by a step size (ΔVpg such as 0.4 V), the Vth jumps of a storage element under the slow programming mode gradually increase, approaching the steady state Vth jumps (ΔVt=ΔVpg). For example the jump from Vth_n+1 to Vth_n+2 may be smallest, while the jump from Vth_n+2 to Vth_n+3 is larger and the jump from Vth_n+3 to Vth_n+4 may be largest, similar to the steady state Vth jumps in the fast programming mode (e.g., jumps from Vth_n−2 to Vth_n−1, Vth_n−1 to Vth_n and Vth_n to Vth_n+1).

As a result, a storage element for which the Vth reaches VH after one program pulse within the slow programming mode will advantageously arrive in the inhibit zone with a smaller ΔVth as compared to a storage element that spent more than one program pulse within the slow programming mode. Note that the width of the final Vth distribution 700 is affected by the last Vth jump that the storage element takes in the slow programming mode, just before crossing the VH level. As the VL to VH gap increases, the probability that a storage element receives more than one program pulse in the slow programming mode increases, and hence the benefit of the slow programming mode is reduced.

The number of program pulses which a storage element receives in the slow programming mode can vary. For example, due to a natural variation in the program speed from storage element to storage element, different storage elements arrive in the slow programming mode at different Vth levels. Some storage elements may enter the slow programming mode with a Vth just above VL, while other storage elements may enter the slow programming mode with a Vth just below VH. Thus, the increase in Vth which is required for different storage elements in the slow programming mode to reach the inhibit zone can vary, which in turn means a different number of program pulses are applied to different storage elements in the slow programming mode. Moreover, even if different storage elements enter the slow programming mode at the same Vth, the size of the Vth jumps for the different storage elements in the slow programming mode can vary due to program noise. Program noise causes storage elements to deviate away from uniform Vth jumps due to quantum mechanical fluctuations. As a result, there is a measurable spread in ΔVth over a population of storage elements at a given program pulse.

As memory devices are scaled down, the problem of variations in program speed among different storage elements is expected to become worse. Thus, the problem of a variation in the number of program pulses applied to different storage elements in the slow programming mode is expected to become worse, reducing the effectiveness of the slow programming mode. A proposal described next uses a dynamic bit line bias for storage elements in the slow programming mode.

FIG. 8A depicts a program operation in which fast and slow programming modes are used, and different bit line voltages are used in the slow programming mode as a function of a count of program pulses in the slow programming mode. In an example approach, during a first program pulse under the slow programming mode, Vbl will be at a relatively low level (e.g., 0.4 V) and will gradually be raised to relatively higher levels for subsequent program pulses that the storage element experiences while still in the slow programming mode. By tracking the number of program pulses applied to each storage element in the slow programming mode, and setting Vbl accordingly, the slow programming mode can be made more effective and relatively independent of the number of program pulses applied to each storage element in the slow programming mode. Overall, the effectiveness of the slow programming mode is improved, resulting in tighter Vth distributions.

A program operation begins at step 800. Step 801 sets data in latches associated with each storage element to be programmed based on a respective target data state of the storage element. For example, this can be data in the LP and UP latches of FIG. 3A, or in the LP, MP and UP latches of FIG. 3C. The data can be loaded in to the latches by the state machine 112, for instance. A program-verify iteration begins at step 802. Step 803 involves reading the latches to determine a Vbl to set for each storage element. In one option, at step 804, data in the latches indicates that fast programming is to be performed so that Vbl is set to Vbl-0 (e.g., 0 V), an initial level which allows programming. In another option, at step 805, data in the latches indicates that slow programming is to be performed so that Vbl is set to one or more stepped up levels (Vbl_s) as a function of a count of program pulses in the slow programming mode. The one or more stepped up levels allow programming. In another option, at step 806, data in the latches indicates that programming is to be inhibited so that Vbl is set to a level (Vbl_inhibit) which inhibits programming.

At step 807, a program pulse is applied to a selected word line with Vbl at the configured level for each selected storage element along the selected word line. At step 808, a verify test is performed for each selected storage element, e.g., using lower and higher verify level VHs associated with the different target data states. In one possible approach, the sensing to determine whether the Vth of a memory cell exceeds the lower verify voltage of its target data state can involve applying the lower verify voltage to the control gate of the memory cell via a word line and determining, after a specified sense time, whether a current through the memory cell and associated NAND string is greater than a reference current. The sense time and reference current can be the same when determining whether the Vth of a memory cell exceeds the higher verify voltage of its target data state. In this case, the higher verify voltage is applied to the control gate of the memory cell via the word line.

In another approach, the same control gate voltage is used to determine whether the Vth of a memory cell exceeds the lower or higher verify voltage. In this case, a sensing parameter such as sense time and/or reference current can be adjusted. For example, the higher verify voltage can be applied to the control gate of a memory cell to determine whether the Vth exceeds the lower verify voltage by using a shorter sense time and/or a lower reference current. In this example, the higher verify voltage can also be applied to the control gate of the memory cell to determine whether the Vth exceeds the higher verify voltage by using a longer sense time and/or a higher reference current. This approach avoids having to generate an additional control gate voltage for sensing the lower verify voltages.

One of three paths is followed for each storage element. In one path, at step 809, for a storage element with a Vth below the lower verify level VL of its target data state (fast programming mode), the data in the respective latches associated with the storage element is not changed. In a second path, at step 810, for a storage element with a Vth between the lower and higher verify level VHs of its target data state (slow programming mode), the data in the respective latches associated with the storage element is updated to increment a count. For example, a count may be initialized to zero and incremented to one when step 810 is performed the first time for a storage element. This indicates that the next program pulse will be the first program pulse that is applied to the storage element while in the slow programming mode. In a third path, at step 811, for a storage element with a Vth above the higher verify level VH of its target data state (inhibit mode), the data in the respective latches associated with the storage element is updated to inhibit programming during the next program pulse. The latches are updated to inhibit programming in the first pass through step 811 and maintained to inhibit programming in subsequent passes through step 811. Note that, once a storage element is inhibited, it is no longer sensed during subsequent program verify tests, since it has already been judged to be at its target Vth level.

Step 812 optionally re-uses a bit combination which is no longer used, to provide one or more additional values for a count of programming pulses in the slow programming mode. See FIG. 8B for further details. The bit combination is re-used from latches associated with a set of storage elements having one target data state which have completed programming, to latches associated with storage elements having another target data state which have not yet completed programming. At decision step 813, if there is a next program-verify iteration, the next program-verify iteration begins at step 802. Otherwise, the program operation ends at step 814.

FIG. 8B provides example details regarding step 812 of FIG. 8A in which a bit combination is re-used in data latches to provide an additional count of program pulses in the slow programming mode. Decision step 820 determines if programming is complete for storage elements of one target data state. This is a predetermined target data state which typically finishes programming sooner than other target data states. For example, in the program operation of FIGS. 4A and 4B, the A state would normally finish programming before the B and C states, and the B state would normally finish programming before the C state. See FIG. 8C, for instance, which indicates that the A state storage elements complete programming after the eight program-verify iterations so that the bit combination re-use can begin with the ninth program-verify iteration.

For the A state, for instance, the completion of programming can occur when the Vth of all, or a specified portion of the storage element whose target state is the A state, has been verified to exceed VvaH, the higher verify level VH for state A. A bit ignore criteria can be used so that programming is considered to be completed even if a small number (e.g., 1-10%) of the A state storage element have not passed the verify test using VvaH. If programming is not complete for the one target data state, a continue step 822 is reached. Step 813 in FIG. 8A is then reached. If programming is complete for the one target data state, step 821 updates latches for storage elements of another target data state (e.g., the B or C state) which have not completed programming with a bit combination which was earlier used to identify the one target data state, before the programming is complete for the one target data state.

For example, the bit combination of 10 (LP=1 and UP=0) can identify the A state. This bit combination is re-used to identify a Bqpw2 state for the B state storage elements, once the A state storage elements have finished programming completely or at least, they have finished the fast programming portion. This provides a count of a second program pulse in the slow programming mode, whereas a count of only one program pulse in the slow programming mode would be available without the re-use of the bit combination. As another example, the bit combination of 10 may be re-used to identify a Cqpw2 state for the C state storage elements. As another example, the bit combination of 10 can be re-used to identify a Bqpw4 state for the B state storage elements. This provides a count of a fourth program pulse in the slow programming mode, whereas a count of only three program pulses in the slow programming mode would be available without the re-use of the bit combination.

By providing an additional count value in the slow programming mode, additional flexibility is obtained in setting Vbl as a function of the count, so that a narrow Vth distribution can be achieved. For example, the additional count value can be used to set an additional Vbl level which allows the Vth to be more precisely controlled. Or, the additional count value can be used to provide a different function of Vbl versus count which allows the Vth to be more precisely controlled. For instance, a new Vbl can be set when the count is four program pulses instead of three program pulses.

Note that when programming is complete for the A state, some portion of the B state storage elements may have already completed programming. As a result, the additional count value for the slow programming mode will be used only by the remaining B state storage elements for which the Vth has not yet reached the respective verify level of VvbH. However, benefits are still obtained since the Vth can be more precisely controlled for these remaining B state storage elements. Similar reasoning applies when the additional count value is provided for the C state storage elements. In practice, when programming is complete for the A state storage elements, fewer C state storage elements than B state storage elements will have completed programming, so that relatively more C state storage elements will benefit from the additional count value.

Many variations are possible with the re-use of bit combinations. For example, bit combinations from multiple target data states may be re-used when programming is completed for those multiple target data states. For example, a bit combination from the A state can be used for the B state when the A state completes programming, as mentioned.

Further, a bit combination from the B state can be used for the C state when the B state completes programming. It is also possible for the bit combination from the A state to be used for the C state when the A state completes programming, and for the bit combination from the B state to be used for the C state when the B state completes programming. This would allow two additional count values for the C state.

In another approach, a bit combination can be re-used by storage elements of multiple target data states in a sequence. For instance, the bit combination from state A can be re-used for state B until a criterion is met, after which the bit combination from state A is re-used for state C and is no longer re-used by state B. In one approach, the criterion is a function of the programming progress of the B state storage elements. For example, the bit combination may be re-used for the B state until some portion of the B state storage elements has completed programming, or until a Vth of some portion of the B state storage elements is above or below a specified verify level. In another approach, the criterion is a specified number of program pulses. For example, the bit combination may be re-used for the B state for four program pulses, after which it is re-used for the C state storage elements.

Re-use of a bit combination by storage elements of multiple target data states provides the benefit of more precise control and flexibility to be shared by storage elements in the multiple target data states.

Generally, a bit combination is a sequence or string of two or more bits. The number of different bit combinations which can be stored in k latches is $2^k$. For example, in the example sets of latches of FIG. 3A, two latches (LP and UP) each store a bit of data in a first bit combination which identifies a target data state. For example, referring also to FIG. 4B, bit combinations 11, 01, 00 and 10 represent the E, A, B and C states, where the first bit in the bit combination represents the LP bit and the second bit in the bit combination represents the UP bit. A bit combination can be written with the lower page bit first followed by one or more higher page bits, or with the higher page bit first followed by one or more lower page bits.

Additionally, two latches (QPW1 and QPW2) each store a bit of data in a second bit combination which identifies a count of program pulses which are applied to a storage element. For example, bit combinations QPW1/QPW2=00, 01, 11, and 10 can represent a count of 0, 1, 2 or 3, respectively.

In this approach, assume one storage element (e.g., 230 in FIG. 2A) is being programmed to a respective target data state (e.g., B or C). Other non-volatile storage elements (e.g., 240, 250 in FIG. 2A) in a program operation reach a target data state (A) before the one non-volatile storage element reaches its target data state (B, C). Further, a set of latches (e.g., set 194, 195 and 196 for storage elements 230, 240 and 250, respectively) for each storage element comprise a number N11 latches (QPW1, QPW2) which each store a bit of data, and a count of program pulses in the slow programming mode zone is determined from the N1 latches. Each set of latches also comprises a number N2≥2 latches (LP, UP) which each store a bit of data, where the target data state of the one non-volatile storage element is determined from the N2 latches.

When programming is not yet completed for the other non-volatile storage elements: the N2 latches comprise one bit combination (e.g., 00 or 01) to identify the target data state (e.g., B or C) of the one non-volatile storage element. The one bit combination (00 or 01) is different than another bit combination (e.g., 10 for the A state) which identifies the target data state of the other non-volatile storage elements in their respective sets of latches (195, 196). When programming is completed for the other (A state) non-volatile storage elements: the N2 latches comprise the another bit combination to identify the target data state of the one non-volatile storage element and to provide, in combination with the N1 latches, an additional value for the count. That is, the 10 combination now identifies the B state, for instance, instead of the A state.

The A state does not need to be identified at this point since programming is completed for the A state. The state machine, for instance, can include logic which cause the update of the latches and now interprets LP/UP=10 in combination with the QPW latch or latches to provide the new count value. For example, the LP/UP/QPW bit combination of 001 may represent a count of one (Bqpw1) and the LP/UP/QPW bit combination of 101 represents a count of two (Bqpw2). The B state thus can count up to two program pulses due to the re-use of the A state bit combination while the C state, for instance, only counts up to one. Or, in another example, the B state can count up to four program pulses due to the re-use of the A state bit combination while the C state, for instance, only counts up to three. The concept can be extended to the use of more than two QPW latches as well.

Note that, for the B state, the count is not based on the N2 latches (LP and UP) when the programming of the other non-volatile storage elements is not yet completed. The N2 latches (LP and UP) only identify the target data state when the programming of the other non-volatile storage elements is not yet completed, and the count is based only on the QPW1 latch. For example, the B state count can be 0 or 1 when QPW1 is 0 or 1, respectively. Or, with the bit combination re-use, the B state count is 2 when LP/UP/QPW1 is 101. In another example, the B state count is 0, 1, 2 or 3 when the QPW1/QPW2 bit combination is 00, 10, 11 or 01, respectively. Or, with the bit combination re-use, the B state count is 4 when LP/UP/QPW1/QPW2 is 1001.

FIG. 8C depicts a program operation in which verify operations are performed for different target data states as the program operation progresses, and where a bit combination can be re-used according to the programming progress. The horizontal axis depicts program pulse number and the vertical axis depicts control gate or word line voltage. Generally, a program operation can involve applying a pulse train to a selected word line, where the pulse train includes multiple program-verify iterations. The program portion of the program-verify iteration comprises a program pulse, and the verify portion of the program-verify iteration comprises one or more verify pulses.

For each program pulse, a square waveform is depicted, although other shapes are possible such as a multilevel shape or a ramped shape. A pulse train typically includes program pulses which increase stepwise in amplitude in each program-verify iteration using a fixed of varying step size. A new pulse train can be applied in each programming pass of a multi-pass program operation, starting at an initial Vpg level and ending at a final Vpg level which does not exceed a maximum allowed level. The initial Vpg levels can be the same or different in different programming passes. The final Vpg levels can also be the same or different in different programming passes. The step size can be the same or different in the different programming passes. In some cases, a smaller step size is used in a final programming pass to reduce Vth distribution widths.

The pulse train 900 includes a series of program pulses 905, 910, 915, 920, 925, 930, 935, 940, 945, 950, 955, 960, 965, 970 and 975 that are applied to a word line selected for programming, and an associated set of non-volatile storage elements. One, two or three verify levels are provided after each program pulse as an example, based on the target data states which are being verified. 0 V may be applied to the selected word line between the program and verify pulses. For example, an A-state verify pulse (e.g., waveform 906) may be applied after each of the first, second and third program pulses 905, 910 and 915, respectively. A- and B-state verify pulses (e.g., waveform 921) may be applied after each of the fourth, fifth and sixth program pulses 920, 925 and 930, respectively. A-, B- and C-state verify pulses (e.g., waveform 936) may be applied after each of the seventh and eighth program pulses 935 and 940, respectively. B- and C-state verify pulses (e.g., waveform 946) may be applied after each of the ninth, tenth and eleventh program pulses 945, 950 and 955, respectively. Finally, a C-state verify pulse (e.g., waveform 961) may be applied after each of the twelfth, thirteenth, fourteenth and fifteenth program pulses 960, 965, 970 and 975, respectively.

In this example, the A state storage elements complete programming after the eighth program pulse so that their bit combination can be re-used starting with the ninth program pulse for the B or C state storage elements. In another example, the B state storage elements complete programming after the eleventh program pulse so that their bit combination (along with the A state bit combination) can be re-used starting with the twelfth program pulse for the C state storage elements.

FIG. 9A depicts a progress of a Vth of a storage element in a program operation where fast and slow programming modes are used, as a result of the program voltage depicted in FIG. 9B and the bit line voltage depicted in 9C, where different bit line voltages Vbl_s1, Vbl_s2 and Vbl_s3 having a common step size are used during a slow programming mode as a function of a count of program pulses in a slow programming mode. A distribution 980 results. For example, the count is 1, 2 or 3 for PPn+1, PPn2 or PPn+3, respectively, and Vbl_s1, Vbl_s2 or Vbl_s3 is used when the count is 1, 2 or 3, respectively. A count of up to three can be provided using two dedicated latches. A count of three is believed to provide a good balance between providing additional control of Vth and minimizing overhead costs. However, a higher maximum count can be used as well. For example, a count of up to seven can be provided using three dedicated latches.

FIG. 9C provides an example of the voltage of the bit line being stepped up in three different program pulses (PPn+1 to PPn+3) of the additional program pulses in the slow programming mode. The different program pulses in which Vbl is stepped up are adjacent in these examples but need not be adjacent.

FIG. 9C provides an example of the voltage of the bit line being set to a first stepped up level (Vbl_s1) when a first program pulse (PPn+1) of the additional program pulses is applied to the one non-volatile storage element, the voltage of the bit line being set to a second stepped up level (Vbl_s2), higher than the first stepped up level, when a second program pulse (PPn+2) of the additional program pulses is applied to the one non-volatile storage element, and the voltage of the bit line being set to a third stepped up level (Vbl_s3), higher than the second stepped up level, when a third program pulse (PPn+3) of the additional program pulses is applied to the one non-volatile storage element.

Once Vbl reaches a maximum level in the slow programming mode for a storage element, it can be maintained at that level for one or more subsequent program pulses until the Vth of the storage element reaches the higher verify level VH, or until programming is considered to be complete for a population of storage elements of the same target data state. Thus, Vbl_s3 (FIG. 9C) can be used for these one or more subsequent program pulses in the slow programming mode. In this case, the voltage of the bit line is stepped up until a maximum level which allows programming of the one non-volatile storage element is reached, after which the voltage of the bit line is set at the maximum level during each of one or more subsequent program pulses which are applied to the one non-volatile storage element, until the Vth of the one non-volatile storage element exceeds a higher verify level VH of the target data state.

In the example of FIG. 7A to 7C, a fixed Vbl (Vbl_s) is applied on the bit lines associated with the storage elements in the slow programming mode. The Vbl is the same regardless of whether the storage element is in the slow programming mode for one program pulse or more than one program pulse. The Vbl is therefore independent of the number of program pulses that have been applied to a storage element in the slow programming mode. In contrast, the approach of FIGS. 9A to 9C sets Vbl as a function of a count of the number of program pulses that are applied to a storage element in slow programming mode. Each storage element can be tracked to determine the number of program pulses that the storage element has experienced in the slow programming mode. Based on the count for each storage element, its associated bit line can be biased at different levels. In one approach, the Vbl is stepped up based on the count, e.g., one step up per increase in the count. For instance, in FIG. 9C, when the first program pulse (PPn+1) having an amplitude Vpg_n+1 is applied to a storage element, the Vbl is set at Vbl_s1 (e.g., 0.4 V). When the second program pulse (PPn+2) having an amplitude Vpg_n+2 is applied to the storage element, the Vbl is set at Vbl_s2 (e.g., 0.6 V). When the third program pulse (PPn+3) having an amplitude Vpg_n+3 is applied to the storage element, the Vbl is set at Vbl_s3 (e.g., 0.8 V). The third program pulse causes the Vth of the storage element to reach Vth_n+4, which exceeds VH, so that the storage element is inhibited from programming when the next program pulse is applied. Specifically, when the next program pulse (PPn+4) having an amplitude Vpg_n+4 is applied to the storage element, the Vbl is set at Vbl_inhibit. Generally, an inhibited storage element will continue to receive a program pulse as remaining storage elements continue to be programmed via the same word line.

By incrementing the Vbl as a function of the count, the Vth jumps of a storage element can be made substantially uniform, so that the effectiveness of the slow programming mode is almost independent of the count. This improves the overall effectiveness of the slow programming mode, resulting in tighter Vth distributions tighter.

For example, a single Vbl may be used in the slow programming mode or alternatively, different Vbl levels can be used in the slow programming mode. In the former case, once the storage element enters the slow programming mode, the Vth of the storage element initially increases at a reduced rate and then at a gradually higher rate which approximates the rate in the fast programming mode. In the latter cases, once the storage element enters the slow programming mode, the Vth of the storage element increases at a reduced rate throughout the slow programming mode. Vth does not increase in the inhibit zone.

Since the rate of change of Vth (ΔVth) can be maintained at a relatively constant level throughout the slow programming mode, the effectiveness of the slow programming mode will be independent of the number of program pulses in the slow programming mode. Thus, a narrow Vth can be achieved even when different storage elements receive a different number of program pulses in the slow programming mode.

In the example of FIGS. 9A to 9C, assume that the Vbl steps up by a fixed amount for each program pulse, e.g., Vbl_s2-Vbl_s1=Vbl_s3-Vbl_s2. However, other scenarios are possible as described below. The drawings are not necessarily to scale, but Vbl_s1 will be generally higher than Vbl step size.

FIG. 9D depicts a variation in the bit line voltages used in the slow programming mode of FIG. 9C as a function of the Vpg step size. The horizontal axis depicts example values for ΔVpg is and the vertical axis depicts ΔVbl. An optimal level of the Vbl step size (e.g., an optimal level of Vbl) during the slow programming mode may be a function of the Vpg step size. In general, a higher ΔVbl should be used when a higher ΔVpg is used. ΔVbl can be less than, the same as, or greater than ΔVpg. Moreover, ΔVpg can be fixed or varying during a program operation in which case Vbl_s1, Vbl_s2 and Vbl_s3 can also be fixed or varying. In this case, for one program pulse of the additional program pulses, the voltage of the bit line is stepped up by a step size which is a function of a step size of the one program pulse.

As discussed, the magnitude of the bit line bias Vbl applied to bit lines during a program operation in the QPW zone may be varied. Due to program noise, some memory cells may take more than one program pulse in the QPW zone (indicated as Slow in FIGS. 7A-7C and FIGS. 9A-9C), which will reduce the efficiency of QPW operation when the bit line bias Vbl applied to bit lines during the program operation is fixed. FIG. 10 shows the memory cell threshold voltage movement when the bit line bias Vbl applied to bit lines during the program operation in the QPW zone is fixed. Assuming LOOP_n is the first loop in QPW zone, the programming of the memory cells will be slowed with a bit line bias (VBL) in LOOP_n. However, if the memory cells do not jump out the QPW zone after LOOP_n, with a fixed QPW bit line bias, the cell slowdown efficiency will be degraded and the cell threshold voltage movement in LOOP_n+1 will become bigger than that in LOOP_n, as shown in FIG. 12, which shows a plot of a change in threshold voltage versus a program voltage Vpgm for a fixed bit line bias and a dynamic or varying bit line bias. More specifically, if the memory cells stay in QPW zone after LOOP_n+1, the cell slowdown efficiency will be further degraded and the memory cell threshold voltage movement will become even bigger in LOOP_n+2. Therefore, the memory cells will jump into the inhibit zone (Inhibit in FIGS. 7A-7C and FIGS. 9A-9C) with a very fast program speed, which leads to a wider threshold voltage distribution. Cell tracking QPW is used to improve this issue, as shown in FIG. 11, which shows the memory cell threshold voltage movement when the bit line bias Vbl applied to bit lines during the program operation in the QPW zone is not fixed. Assuming LOOP_n is the first loop in QPW zone, in LOOP_n, the memory cells are QPW programmed with bit line bias VQPW1 (e.g., 0.8 volts) and the threshold voltage movement is slowed down. In LOOP_n+1, if the memory cells still stay in QPW zone in this loop, the memory cells are QPW programmed with increasing bit line bias VQPW2 (e.g., 1 volt)(VQPW1<VQPW2) to keep the slowdown efficiency no degradation. If the memory cells jump into the inhibit zone in this loop, the memory cells are inhibited with bit line bias of an inhibiting voltage (e.g., a supply voltage VDDSA). In LOOP_n+2, if the memory cells stay in QPW zone in this loop, the memory cells are QPW programmed with increasing bit line bias VQPW3 (e.g., 1.2 volts) (VQPW1<VQPW2<VQPW3) to keep the slowdown efficiency with no degradation. If the cells jump into the inhibit zone in this loop, cells are inhibited with bit line bias being the inhibiting voltage VDDSA. Compared to QPW with a fixed bit line voltage applied in the QPW zone, such conventional cell tracking QPW keeps the memory cell slowdown efficiency with no degradation by increasing bit line voltage if the memory cells take more than one pulse in QPW zone.

FIG. 13 shows a plot of threshold voltages of example memory cells in each of a plurality of program pulses (i.e., programming loops) for various widths of the program pulses. As the program pulse width decreases, the memory cell program, speed slows down. Based on this mechanism, a bit line timing based cell tracking QPW may be used. So, instead of varying the magnitude of the bit line voltage Vbl in the QPW zone, the time during which the bit line voltage Vbl is applied may be varied.

Consequently, described herein is a memory apparatus (e.g., memory device 190 in FIG. 1) including memory cells (e.g., storage elements 230, 240, 250, 260 and 270 in FIG. 2A). Each of the memory cells is connected to one of a plurality of word lines (e.g., WL0-WL63 in FIG. 2A) and configured to retain a threshold voltage Vth corresponding to one of a plurality of data states (e.g., "Er", "A", "B", "C", "D", "E", "F" and "G" in FIG. 6D). The memory cells are also disposed in memory holes (e.g., NAND strings NS0-NS11 of FIG. 2A) each coupled to one of a plurality of bit lines (e.g., bit lines BL0-BL11 of FIG. 2A). The memory apparatus also includes a control means (e.g., control circuitry 110, controller 152, decoders 130, 160, read/write circuits 165, and sense blocks SB0, SB1, SBn−1 in FIG. 1) coupled to the plurality of word lines and the plurality of bit lines and configured to apply a plurality of program pulses (of a program voltage VPGM, 20 volts for example) to selected ones of the plurality of word lines. The control means is additionally configured to, for each one of the memory cells, determine when the threshold voltage of the one of the memory cells exceeds a lower verify level VL of one of the plurality of data states targeted and maintain a respective count of a number of the plurality of program pulses subsequently applied to the one of the memory cells before the one of the memory cells reaches a lockout state. Each of the plurality of program pulses has a program pulse duration divided into a plurality of program pulse phases. The control means is also configured to, for each one of the of the memory cells, set a voltage of one of the plurality of bit lines coupled to the one of the memory cells at a stepped up level as a function of the respective count and according to each of the plurality of program pulse phases in which the voltage is set to the stepped up level. Such an approach may be referred to as a bit line timing based cell tracking QPW. According to an aspect, the stepped up level is an inhibiting voltage (e.g., supply voltage VDDSA, 2.2 volts for example). The inhibiting voltage is selected to prevent programming of the one of the memory cells. According to another aspect, a time period during which the voltage is set to the stepped up level increases from an initial duration in a first one of the plurality of program pulse phases to increasingly higher durations in subsequent ones of the plurality of program pulse phases.

The plurality of program pulse phases can include, in sequential order, a first program pulse phase and a second program pulse phase and a third program pulse phase and a fourth program pulse phase. In addition, the plurality of program pulses may include a first program pulse applied to the one of the memory cells after the one of the memory cells exceeds the lower verify level VL of one of the plurality of data states targeted and comprising a first slow programming loop LOOP_n and a second program pulse applied to the one of the memory cells after the first program pulse and comprising a second slow programming loop LOOP_n+1 and a third program pulse applied to the one of the memory cells after the second program pulse and comprising a third slow programming loop LOOPn+2. Thus, according to further aspects of the disclosure, the control means is further configured to, for each one of the of the memory cells, set the voltage of the one of the plurality of bit lines coupled to the one of the memory cells to approximately zero volts in the first program pulse phase and the second program pulse phase and the third program pulse phase of the first program pulse (during the first slow programming loop LOOP_n) and set the voltage of one of the plurality of bit lines coupled to the one of the memory cells to the stepped up level in the fourth program pulse phase of the first program pulse. The control means is also configured to, for each one of the of the memory cells, set the voltage of one of the plurality of bit lines coupled to the one of the memory cells to approximately zero volts in the first program pulse phase and the second program pulse phase of the second program pulse (during the second slow programming loop LOOP_n+1) and set the voltage of the one of the plurality of bit lines coupled to the one of the memory cells to the stepped up level in the third program pulse phase and the fourth program pulse phase of the second program pulse. The control means is additionally configured to, for each one of the of the memory cells, set the voltage of one of the plurality of bit lines coupled to the one of the memory cells to approximately zero volts in the first program pulse phase of the third program pulse (during the third slow programming loop LOOP_n+2) and set the voltage of the one of the plurality of bit lines coupled to the one of the memory cells to the stepped up level in the second program pulse phase and third program pulse phase and the fourth program pulse phase of the third program pulse.

FIG. 14 shows the bit line voltage comparison of the bit line timing based cell tracking QPW described herein versus the conventional cell tracking QPW for each type of memory cells. FIG. 15 shows the voltages applied to various bit lines and word lines along with the associated timing for the conventional cell tracking QPW. In contrast, FIG. 16 shows the voltages applied to various bit lines and word lines along with the associated timing for the bit line timing based cell tracking QPW described herein. As shown, the control means is further configured to set the voltage of ones of the plurality of bit lines other than ones of the plurality of bit lines set to the stepped up level to approximately zero volts to allow programming. So, assuming the first slow programming loop LOOP_n is the first loop in QPW zone, the program pulse duration of the program pulse is divided into four program pulse phases (Phase_1/Phase_2/Phase_3/ Phase_4). In first slow programming loop LOOP_n, the memory cells are normal programmed (i.e., not slowed down) with bit line bias 0V in Phase_1/Phase_2/Phase_3, and the memory cells are inhibited with bit line bias of the inhibiting voltage (e.g., supply voltage VDDSA) in Phase_4. By controlling the bit line timing in these four program pulse phases, the threshold voltage movement is slowed down in first slow programming loop LOOP_n. In the second slow programming loop LOOP_n+1, if the memory cells still stay in QPW zone in this loop, the memory cells are normal programmed with bit line bias of the steady state voltage VSS (e.g., 0 volts) in Phase_1/Phase_2, and cells are inhibited with bit line bias set to the inhibiting voltage (e.g., supply VDDSA) in Phase_3/Phase_4, keeping the slow-down efficiency with no degradation. If the memory cells jump into the inhibit zone in this loop, the memory cells are inhibited with the bit line bias set to the inhibiting voltage (e.g., VDDSA) in all four phases. In the third slow pro-gramming loop LOOP_n+2, if the memory cells stay in QPW zone in this loop, the memory cells are normal programmed with bit line bias 0V in Phase_1, and the memory cells are inhibited with the bit line bias set to the inhibiting voltage (e.g., VDDSA) in Phase_2/Phase_3/ Phase_4, keeping the slowdown efficiency with no degra-dation. If the memory cells jump into the inhibit zone in this loop, cells are inhibited with BL bias VDDSA in all four phases.

According to another aspect of the disclosure, the control means is further configured to set the voltage of one of the plurality of bit lines coupled to the each of the memory cells reaching the lockout state (i.e., INHIBIT CELLS) to the inhibiting voltage (e.g., supply voltage VDDSA) selected to prevent programming of the memory cells. The memory cells transition to the lockout state in response to the threshold voltage of the memory cells exceeding a higher verify level VH of one of the plurality of data states targeted for the memory cells. The higher verify level VH is greater than the lower verify level VL.

Referring back to FIG. 2A, for example, the plurality of word lines (e.g., word lines WL0-WL63) and a plurality of dielectric layers extend horizontally and overlay one another in an alternating fashion in a stack. The memory holes (e.g., NAND strings NS0-NS11) extend vertically through the stack. The memory cells are connected in series between at least one drain-side select gate transistor (e.g., SGD) on a drain-side of each of the memory holes and at least one source-side select gate transistor (e.g., SGS) on a source-side of each of the memory holes. The at least one drain-side select gate transistor of each of the memory holes is con-nected to one of the plurality of bit lines (e.g., bit lines BL0-BL11) and the at least one source-side select gate transistor of each of the memory holes is connected to a source line, (e.g., source line 220). The plurality of word lines may include at least one drain-side dummy word line (e.g., WL63 of FIG. 2A) immediately adjacent to and below the at least one drain-side select gate transistor of each of the memory holes in the stack and at least one source-side dummy word line (e.g., WL0 of FIG. 2A) immediately adjacent to and above the at least one source-side select gate transistor of each of the memory holes in the stack. So, according to an aspect and referring back to FIG. 16, the control means is further configured to apply a pass voltage VPASS (e.g., 9 volts) to unselected ones of the plurality of word lines during the program pulse duration of each of the plurality of program pulses. The control means is also configured to apply a gate transistor voltage VSGD (e.g., 2.4 volts) to the at least one drain-side select gate transistor of each of the memory holes including the memory cells being programmed (SEL SGD) during the program pulse duration of each of the plurality of program pulses. In addition, the control means is configured to apply a steady state voltage VSS (e.g., 0 volts) to the at least one drain-side select gate transistor of each of the memory holes including the memory cells not being programmed (UNSEL SGD) during the program pulse duration of each of the plurality of program pulses. The control means is additionally config-ured to apply a dummy word line voltage VPG (e.g., 6.5 volts) to the at least one drain-side dummy word line and the at least one source-side dummy word line during the program pulse duration of each of the plurality of program pulses. The control means is also configured to apply the steady state voltage VSS to the at least one source-side select gate transistor of each of the memory holes during the program pulse duration of each of the plurality of program pulses.

Now referring to FIG. 17, a method of operating a memory apparatus is also provided. As discussed above, the memory apparatus (e.g., memory device 190 in FIG. 1) includes memory cells (e.g., storage elements 230, 240, 250, 260 and 270 in FIG. 2A). Each of the memory cells is connected to one of a plurality of word lines (e.g., WL0-WL63 in FIG. 2A) and configured to retain a threshold voltage Vth corresponding to one of a plurality of data states (e.g., "Er", "A", "B", "C", "D", "E", "F" and "G" in FIG. 6D). The memory cells are also disposed in memory holes (e.g., NAND strings NS0-NS11 of FIG. 2A) each coupled to one of a plurality of bit lines (e.g., bit lines BL0-BL11 of FIG. 2A. So, the method includes the step of 1700 applying a plurality of program pulses to selected ones of the plurality of word lines. The method additionally includes the step of 1702 for each one of the memory cells, determining when the threshold voltage of the one of the memory cells exceeds a lower verify level VL of one of the plurality of data states targeted and maintaining a respective count of a number of the plurality of program pulses subsequently applied to the one of the memory cells before the one of the memory cells reaches a lockout state, each of the plurality of program pulses having a program pulse duration divided into a plurality of program pulse phases. The method also includes the step of 1704 for each one of the of the memory cells, setting a voltage of one of the plurality of bit lines coupled to the one of the memory cells at a stepped up level as a function of the respective count and according to each of the plurality of program pulse phases in which the voltage is set to the stepped up level. Again, the stepped up level is the inhibiting voltage (e.g., supply voltage VDDSA). The inhibiting voltage is selected to prevent programming of the one of the memory cells. As described above and according to another aspect, the time period during which the voltage may be set to the stepped up level increases from an initial duration in a first one of the plurality of program pulse phases to increasingly higher durations in subsequent ones of the plurality of program pulse phases.

Once again, the plurality of program pulse phases can include, in sequential order, the first program pulse phase and the second program pulse phase and the third program pulse phase and the fourth program pulse phase. In addition, the plurality of program pulses may include a first program pulse applied to the one of the memory cells after the one of the memory cells exceeds the lower verify level VL of one of the plurality of data states targeted and comprising a first slow programming loop LOOP_n and a second program pulse applied to the one of the memory cells after the first program pulse and comprising a second slow programming loop LOOP_n+1 and a third program pulse applied to the one of the memory cells after the second program pulse and comprising a third slow programming loop LOOPn+2. Thus, according to further aspects of the disclosure, the method further includes the step of, for each one of the of the memory cells, setting the voltage of the one of the plurality of bit lines coupled to the one of the memory cells to approximately zero volts in the first program pulse phase and the second program pulse phase and the third program pulse phase of the first program pulse (during the first slow programming loop LOOP_n) and setting the voltage of one of the plurality of bit lines coupled to the one of the memory cells to the stepped up level in the fourth program pulse phase of the first program pulse. The method continues by, for each one of the of the memory cells, setting the voltage of one of the plurality of bit lines coupled to the one of the memory cells to approximately zero volts in the first program pulse phase and the second program pulse phase of the second program pulse (during the second slow programming loop LOOP_n+1) and setting the voltage of the one of the plurality of bit lines coupled to the one of the memory cells to the stepped up level in the third program pulse phase and the fourth program pulse phase of the second program pulse. The method proceeds by, for each one of the of the memory cells, setting the voltage of one of the plurality of bit lines coupled to the one of the memory cells to approximately zero volts in the first program pulse phase of the third program pulse (during the third slow programming loop LOOP_n+2) and setting the voltage of the one of the plurality of bit lines coupled to the one of the memory cells to the stepped up level in the second program pulse phase and the third program pulse phase and the fourth program pulse phase of the third program pulse.

Referring back to FIGS. 14 and 16, the method further includes the step of setting the voltage of ones of the plurality of bit lines other than ones of the plurality of bit lines set to the stepped up level to approximately zero volts to allow programming.

Again, according to another aspect of the disclosure, the method further including the step of setting the voltage of one of the plurality of bit lines coupled to the each of the memory cells reaching the lockout state to an inhibiting voltage selected to prevent programming of the memory cells. As above, the memory cells transition to the lockout state in response to the threshold voltage of the memory cells exceeding a higher verify level VH of one of the plurality of data states targeted for the memory cells. The higher verify level VH is greater than the lower verify level VL.

Again, referring back to FIG. 2A, for example, the plurality of word lines (e.g., word lines WL0-WL63) and a plurality of dielectric layers extend horizontally and overlay one another in an alternating fashion in a stack. The memory holes (e.g., NAND strings NS0-NS11) extend vertically through the stack. The memory cells are connected in series between at least one drain-side select gate transistor (e.g., SGD) on a drain-side of each of the memory holes and at least one source-side select gate transistor (e.g., SGS) on a source-side of each of the memory holes. The at least one drain-side select gate transistor of each of the memory holes is connected to one of the plurality of bit lines (e.g., bit lines BL0-BL11) and the at least one source-side select gate transistor of each of the memory holes is connected to a source line, (e.g., source line 220). The plurality of word lines may include at least one drain-side dummy word line (e.g., WL63 of FIG. 2A) immediately adjacent to and below the at least one drain-side select gate transistor of each of the memory holes in the stack and at least one source-side dummy word line (e.g., WL0 of FIG. 2A) immediately adjacent to and above the at least one source-side select gate transistor of each of the memory holes in the stack. Thus, according to an aspect and referring back to FIG. 16, the method further includes the step of applying a pass voltage VPASS to unselected ones of the plurality of word lines during the program pulse duration of each of the plurality of program pulses. The method continues with the step of applying a gate transistor voltage VSGD to the at least one drain-side select gate transistor of each of the memory holes including the memory cells being programmed (SLE SGD) during the program pulse duration of each of the plurality of program pulses. The method continues by applying a steady state voltage VSS to the at least one drain-side select gate transistor of each of the memory holes including the memory cells not being programmed (UNSEL SGD) during the program pulse duration of each of the plurality of program pulses. The method additionally includes the step of applying a dummy word line voltage VPG to the at least one drain-side dummy word line and the at least one source-side dummy word line during the program pulse duration of each of the plurality of program pulses. The method also includes the step of applying a steady state voltage VSS to the at least one source-side select gate transistor of each of the memory holes during the program pulse duration of each of the plurality of program pulses.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

What is claimed is:

1. A memory apparatus, comprising:
memory cells each connected to one of a plurality of word lines and configured to store a threshold voltage corresponding to one of a plurality of data states and disposed in memory holes each coupled to one of a plurality of bit lines; and
a control means coupled to the plurality of word lines and the plurality of bit lines and configured to:
apply a plurality of program pulses to selected ones of the plurality of word lines,
for each one of the memory cells, determine when the threshold voltage of the one of the memory cells exceeds a lower verify level of one of the plurality of data states targeted and maintain a respective count of a number of the plurality of program pulses subsequently applied to the one of the memory cells before the one of the memory cells reaches a lockout state, each of the plurality of program pulses having a program pulse duration divided into a plurality of program pulse phases, and
for each one of the memory cells, set a voltage of one of the plurality of bit lines coupled to the one of the memory cells at a stepped up level as a function of the respective count and according to each of the plurality of program pulse phases in which the voltage is set to the stepped up level and differently based on the one of the memory cells being in an inhibit zone or not, the one of the memory cells being in the inhibit zone with the threshold voltage greater than a higher verify level of the one of the plurality of data states targeted, and the higher verify level being greater than the lower verify level.

2. The memory apparatus as set forth in claim 1, wherein the control means is further configured to set the voltage of the one of the plurality of bit lines coupled to the one of the memory cells at the stepped up level based on the threshold voltage of the one of the memory cells relative to the lower verify level and whether the one of the memory cells is in a quick pass write zone instead of the inhibit zone, the one of the memory cells being in the quick pass write zone with the threshold voltage greater than the lower verify level of the one of the plurality of data states targeted and less than the higher verify level of the one of the plurality of data states targeted.

3. The memory apparatus as set forth in claim 1, wherein the control means is further configured to set the voltage of the one of the plurality of bit lines coupled to the one of the memory cells at the stepped up level differently based on the one of the memory cells being in one of a quick pass write zone and an inhibit zone, the one of the memory cells being in the quick pass write zone with the threshold voltage greater than the lower verify level of the one of the plurality of data states targeted and less than a higher verify level of the one of the plurality of data states targeted, the one of the memory cells being in the inhibit zone with the threshold voltage greater than the higher verify level of the one of the plurality of data states targeted, and the higher verify level being greater than the lower verify level.

4. The memory apparatus as set forth in claim 1, wherein a time period during which the voltage is set to the stepped up level increases from an initial duration in a first one of the plurality of program pulse phases to increasingly higher durations in subsequent ones of the plurality of program pulse phases.

5. The memory apparatus as set forth in claim 1, wherein the plurality of program pulse phases includes, in sequential order, a first program pulse phase and a second program pulse phase and a third program pulse phase and a fourth program pulse phase, the plurality of program pulses includes a first program pulse applied to the one of the memory cells after the one of the memory cells exceeds the lower verify level of one of the plurality of data states targeted and comprising a first slow programming loop and a second program pulse applied to the one of the memory cells after the first program pulse and comprising a second slow programming loop and a third program pulse applied to the one of the memory cells after the second program pulse and comprising a third slow programming loop, and the control means is further configured to:

> for each one of the memory cells, set the voltage of the one of the plurality of bit lines coupled to the one of the memory cells to approximately zero volts in the first program pulse phase and the second program pulse phase and the third program pulse phase of the first program pulse and set the voltage of one of the plurality of bit lines coupled to the one of the memory cells to the stepped up level in the fourth program pulse phase of the first program pulse;
>
> for each one of the memory cells, set the voltage of one of the plurality of bit lines coupled to the one of the memory cells to approximately zero volts in the first program pulse phase and the second program pulse phase of the second program pulse and set the voltage of the one of the plurality of bit lines coupled to the one of the memory cells to the stepped up level in the third program pulse phase and the fourth program pulse phase of the second program pulse; and
>
> for each one of the memory cells, set the voltage of one of the plurality of bit lines coupled to the one of the memory cells to approximately zero volts in the first program pulse phase of the third program pulse and set the voltage of the one of the plurality of bit lines coupled to the one of the memory cells to the stepped up level in the second program pulse phase and the third program pulse phase and the fourth program pulse phase of the third program pulse.

6. The memory apparatus as set forth in claim 1, wherein the control means is further configured to set the voltage of one of the plurality of bit lines coupled to the each of the memory cells reaching the lockout state to an inhibiting voltage selected to prevent programming of the memory cells, the memory cells transitioning to the lockout state in response to the threshold voltage of the memory cells exceeding a higher verify level of one of the plurality of data states targeted for the memory cells, the higher verify level is greater than the lower verify level.

7. The memory apparatus as set forth in claim 1, wherein the plurality of word lines and a plurality of dielectric layers extend horizontally and overlay one another in an alternating fashion in a stack, the memory holes extend vertically through the stack, the memory cells are connected in series between at least one drain-side select gate transistor on a drain-side of each of the memory holes and at least one source-side select gate transistor on a source-side of each of the memory holes, the at least one drain-side select gate transistor of each of the memory holes is connected to one of the plurality of bit lines and the at least one source-side select gate transistor of each of the memory holes is connected to a source line, the plurality of word lines including at least one drain-side dummy word line immediately adjacent to and below the at least one drain-side select gate transistor of each of the memory holes in the stack and at least one source-side dummy word line immediately adjacent to and above the at least one source-side select gate transistor of each of the memory holes in the stack, and the control means is further configured to:

> apply a pass voltage to unselected ones of the plurality of word lines during the program pulse duration of each of the plurality of program pulses;
>
> apply a gate transistor voltage to the at least one drain-side select gate transistor of each of the memory holes including the memory cells being programmed during the program pulse duration of each of the plurality of program pulses;
>
> apply a steady state voltage to the at least one drain-side select gate transistor of each of the memory holes including the memory cells not being programmed during the program pulse duration of each of the plurality of program pulses;
>
> apply a dummy word line voltage to the at least one drain-side dummy word line and the at least one source-side dummy word line during the program pulse duration of each of the plurality of program pulses; and
>
> apply the steady state voltage to the at least one source-side select gate transistor of each of the memory holes during the program pulse duration of each of the plurality of program pulses.

8. A controller in communication with a memory apparatus including memory cells each connected to one of a plurality of word lines and configured to store a threshold voltage corresponding to one of a plurality of data states and disposed in memory holes each coupled to one of a plurality of bit lines, the controller configured to:

> instruct the memory apparatus to apply a plurality of program pulses to selected ones of the plurality of word lines;
>
> for each one of the memory cells, instruct the memory apparatus to determine when the threshold voltage of the one of the memory cells exceeds a lower verify level of one of the plurality of data states targeted and maintain a respective count of a number of the plurality of program pulses subsequently applied to the one of the memory cells before the one of the memory cells reaches a lockout state, each of the plurality of program pulses having a program pulse duration divided into a plurality of program pulse phases; and
>
> for each one of the memory cells, instruct the memory apparatus to set a voltage of one of the plurality of bit lines coupled to the one of the memory cells at a stepped up level as a function of the respective count and according to each of the plurality of program pulse phases in which the voltage is set to the stepped up level and differently based on the one of the memory cells being in an inhibit zone or not, the one of the memory cells being in the inhibit zone with the threshold voltage greater than a higher verify level of the one of the plurality of data states targeted, and the higher verify level being greater than the lower verify level.

9. The controller as set forth in claim 8, wherein the stepped up level is an inhibiting voltage, the inhibiting voltage selected to prevent programming of the one of the memory cells.

10. The controller as set forth in claim 8, wherein the controller is further configured to instruct the memory apparatus to set the voltage of the one of the plurality of bit lines coupled to the one of the memory cells at the stepped up level differently based on the one of the memory cells being in one of a quick pass write zone and an inhibit zone, the one of the memory cells being in the quick pass write zone with the threshold voltage greater than the lower verify level of the one of the plurality of data states targeted and less than a higher verify level of the one of the plurality of data states targeted, the one of the memory cells being in the inhibit zone with the threshold voltage greater than the higher verify level of the one of the plurality of data states targeted, and the higher verify level being greater than the lower verify level.

11. The controller as set forth in claim 8, wherein a time period during which the voltage is set to the stepped up level increases from an initial duration in a first one of the plurality of program pulse phases to increasingly higher durations in subsequent ones of the plurality of program pulse phases.

12. The controller as set forth in claim 8, wherein the plurality of program pulse phases includes, in sequential order, a first program pulse phase and a second program pulse phase and a third program pulse phase and a fourth program pulse phase, the plurality of program pulses includes a first program pulse applied to the one of the memory cells after the one of the memory cells exceeds the lower verify level of one of the plurality of data states targeted and comprising a first slow programming loop and a second program pulse applied to the one of the memory cells after the first program pulse and comprising a second slow programming loop and a third program pulse applied to the one of the memory cells after the second program pulse and comprising a third slow programming loop, and the controller is further configured to:

for each one of the memory cells, instruct the memory apparatus to set the voltage of the one of the plurality of bit lines coupled to the one of the memory cells to approximately zero volts in the first program pulse phase and the second program pulse phase and the third program pulse phase of the first program pulse and set the voltage of one of the plurality of bit lines coupled to the one of the memory cells to the stepped up level in the fourth program pulse phase of the first program pulse;

for each one of the memory cells, instruct the memory apparatus to set the voltage of one of the plurality of bit lines coupled to the one of the memory cells to approximately zero volts in the first program pulse phase and the second program pulse phase of the second program pulse and set the voltage of the one of the plurality of bit lines coupled to the one of the memory cells to the stepped up level in the third program pulse phase and the fourth program pulse phase of the second program pulse; and for each one of the memory cells, instruct the memory apparatus to set the voltage of one of the plurality of bit lines coupled to the one of the memory cells to approximately zero volts in the first program pulse phase of the third program pulse and set the voltage of the one of the plurality of bit lines coupled to the one of the memory cells to the stepped up level in the second program pulse phase and the third program pulse phase and the fourth program pulse phase of the third program pulse.

13. The controller as set forth in claim 8, wherein the controller is further configured to instruct the memory apparatus to set the voltage of one of the plurality of bit lines coupled to the each of the memory cells reaching the lockout state to an inhibiting voltage selected to prevent programming of the memory cells, the memory cells transitioning to the lockout state in response to the threshold voltage of the memory cells exceeding a higher verify level of one of the plurality of data states targeted for the memory cells, the higher verify level is greater than the lower verify level.

14. A method of operating a memory apparatus including memory cells each connected to one of a plurality of word lines and configured to store a threshold voltage corresponding to one of a plurality of data states and disposed in memory holes each coupled to one of a plurality of bit lines; the method comprising the steps of:

applying a plurality of program pulses to selected ones of the plurality of word lines;

for each one of the memory cells, determining when the threshold voltage of the one of the memory cells exceeds a lower verify level of one of the plurality of data states targeted and maintaining a respective count of a number of the plurality of program pulses subsequently applied to the one of the memory cells before the one of the memory cells reaches a lockout state, each of the plurality of program pulses having a program pulse duration divided into a plurality of program pulse phases; and for each one of the memory cells, setting a voltage of one of the plurality of bit lines coupled to the one of the memory cells at a stepped up level as a function of the respective count and according to each of the plurality of program pulse phases in which the voltage is set to the stepped up level and differently based on the one of the memory cells being in an inhibit zone or not, the one of the memory cells being in the inhibit zone with the threshold voltage greater than a higher verify level of the one of the plurality of data states targeted, and the higher verify level being greater than the lower verify level.

15. The method as set forth in claim 14, wherein the stepped up level is an inhibiting voltage, the inhibiting voltage selected to prevent programming of the one of the memory cells.

16. The method as set forth in claim 14, wherein the method further includes the step of setting the voltage of the one of the plurality of bit lines coupled to the one of the memory cells at the stepped up level based on the threshold voltage of the one of the memory cells relative to the lower verify level and whether the one of the memory cells is in a quick pass write zone instead of the inhibit zone, the one of the memory cells being in the quick pass write zone with the threshold voltage greater than the lower verify level of the one of the plurality of data states targeted and less than the higher verify level of the one of the plurality of data states targeted.

17. The method as set forth in claim 14, wherein a time period during which the voltage is set to the stepped up level increases from an initial duration in a first one of the plurality of program pulse phases to increasingly higher durations in subsequent ones of the plurality of program pulse phases.

18. The method as set forth in claim 14, wherein the plurality of program pulse phases includes, in sequential order, a first program pulse phase and a second program pulse phase and a third program pulse phase and a fourth program pulse phase, the plurality of program pulses includes a first program pulse applied to the one of the memory cells after the one of the memory cells exceeds the lower verify level of one of the plurality of data states targeted and comprising a first slow programming loop and a second program pulse applied to the one of the memory cells after the first program pulse and comprising a second slow programming loop and a third program pulse applied to the one of the memory cells after the second program pulse and comprising a third slow programming loop, and the method further includes the steps of:

for each one of the memory cells, setting the voltage of the one of the plurality of bit lines coupled to the one of the memory cells to approximately zero volts in the first program pulse phase and the second program pulse phase and the third program pulse phase of the first program pulse and setting the voltage of one of the plurality of bit lines coupled to the one of the memory cells to the stepped up level in the fourth program pulse phase of the first program pulse;

for each one of the memory cells, setting the voltage of one of the plurality of bit lines coupled to the one of the memory cells to approximately zero volts in the first program pulse phase and the second program pulse phase of the second program pulse and setting the voltage of the one of the plurality of bit lines coupled to the one of the memory cells to the stepped up level in the third program pulse phase and the fourth program pulse phase of the second program pulse; and for each one of the memory cells, setting the voltage of one of the plurality of bit lines coupled to the one of the memory cells to approximately zero volts in the first program pulse phase of the third program pulse and setting the voltage of the one of the plurality of bit lines coupled to the one of the memory cells to the stepped up level in the second program pulse phase and the third program pulse phase and the fourth program pulse phase of the third program pulse.

19. The method as set forth in claim 14, further including the step of setting the voltage of one of the plurality of bit lines coupled to the each of the memory cells reaching the lockout state to an inhibiting voltage selected to prevent programming of the memory cells, the memory cells transitioning to the lockout state in response to the threshold voltage of the memory cells exceeding a higher verify level of one of the plurality of data states targeted for the memory cells, the higher verify level is greater than the lower verify level.

20. The method as set forth in claim 14, wherein the plurality of word lines and a plurality of dielectric layers extend horizontally and overlay one another in an alternating fashion in a stack, the memory holes extend vertically through the stack, the memory cells are connected in series between at least one drain-side select gate transistor on a drain-side of each of the memory holes and at least one source-side select gate transistor on a source-side of each of the memory holes, the at least one drain-side select gate transistor of each of the memory holes is connected to one of the plurality of bit lines and the at least one source-side select gate transistor of each of the memory holes is connected to a source line, the plurality of word lines including at least one drain-side dummy word line immediately adjacent to and below the at least one drain-side select gate transistor of each of the memory holes in the stack and at least one source-side dummy word line immediately adjacent to and above the at least one source-side select gate transistor of each of the memory holes in the stack, and the method further includes the steps of:

applying a pass voltage to unselected ones of the plurality of word lines during the program pulse duration of each of the plurality of program pulses;

applying a gate transistor voltage to the at least one drain-side select gate transistor of each of the memory holes including the memory cells being programmed during the program pulse duration of each of the plurality of program pulses;

applying a steady state voltage to the at least one drain-side select gate transistor of each of the memory holes including the memory cells not being programmed during the program pulse duration of each of the plurality of program pulses;

applying a dummy word line voltage to the at least one drain-side dummy word line and the at least one source-side dummy word line during the program pulse duration of each of the plurality of program pulses; and applying the steady state voltage to the at least one source-side select gate transistor of each of the memory holes during the program pulse duration of each of the plurality of program pulses.

* * * * *